(12) United States Patent
Amoroso et al.

(10) Patent No.: US 7,858,721 B2
(45) Date of Patent: Dec. 28, 2010

(54) PHOTOSENSITIVE DIELECTRIC RESIN COMPOSITIONS, FILMS FORMED THEREFROM AND SEMICONDUCTOR AND DISPLAY DEVICES ENCOMPASSING SUCH FILMS

(75) Inventors: Dino Amoroso, Medina, OH (US); Brian Bedwell, Brecksville, OH (US); Andrew Bell, Lakewood, OH (US); Edmund Elce, Lakewood, OH (US); Rajesh Raja Puthenkovilakom, North Royalton, OH (US); Ramakrishna Ravikiran, Strongsville, OH (US); Robert Shick, Strongsville, OH (US); Xiaoming Wu, Strongsville, OH (US); Hiroaki Makabe, Tokyo (JP); Yasunori Takahashi, Tokyo (JP); Etsu Takeuchi, Tokyo (JP); Daoji Gan, Indianapolis, IN (US); Seok Ho Kang, Marlborough, MA (US)

(73) Assignee: Promerus LLC, Brecksville, OH (US)

( * ) Notice: Subject to any disclaimer, the term of this patent is extended or adjusted under 35 U.S.C. 154(b) by 0 days.

(21) Appl. No.: 12/387,025

(22) Filed: Apr. 27, 2009

(65) Prior Publication Data

US 2009/0215976 A1  Aug. 27, 2009

Related U.S. Application Data

(63) Continuation of application No. 11/171,391, filed on Jul. 1, 2005, now Pat. No. 7,524,594.

(60) Provisional application No. 60/586,070, filed on Jul. 7, 2004.

(51) Int. Cl.
*C08F 232/02* (2006.01)
*G03F 7/004* (2006.01)

(52) U.S. Cl. ................... 526/281; 430/270.1; 430/905
(58) Field of Classification Search ................ 526/281; 430/270.1, 905
See application file for complete search history.

(56) References Cited

U.S. PATENT DOCUMENTS

| | | | | |
|---|---|---|---|---|
| 6,136,499 A | * | 10/2000 | Goodall et al. | 430/270.1 |
| 6,964,840 B2 | * | 11/2005 | Nishimura et al. | 430/270.1 |
| 7,524,594 B2 | * | 4/2009 | Amoroso et al. | 430/18 |
| 2004/0005512 A1 | * | 1/2004 | Mizutani et al. | 430/270.1 |
| 2004/0101787 A1 | * | 5/2004 | Naito et al. | 430/325 |

* cited by examiner

*Primary Examiner*—John S Chu
(74) *Attorney, Agent, or Firm*—Bernard Berman

(57) ABSTRACT

Some embodiments in accordance with the present invention relate to norbornene-type polymers and to photosensitive dielectric resin compositions formed therefrom. Other embodiments relate to films formed from such compositions and to devices, such as electrical, electronic and optoelectronic devices, that encompass such films.

3 Claims, No Drawings

PHOTOSENSITIVE DIELECTRIC RESIN COMPOSITIONS, FILMS FORMED THEREFROM AND SEMICONDUCTOR AND DISPLAY DEVICES ENCOMPASSING SUCH FILMS

This application is a Continuation of U.S. patent application Ser. No. 11/171,391, filed Jul. 1, 2005 now U.S. Pat. No. 7,524,594, which claims priority to U.S. Provisional Application 60/586,070, filed Jul. 7, 2004, which are incorporated herein by reference.

TECHNICAL FIELD

The present invention relates generally to a photosensitive dielectric resin compositions and more particularly to films formed from such compositions and to semiconductor and display devices that encompass such films.

DETAILED DESCRIPTION

Generally, display devices such as thin-film transistor type liquid crystal displays (TFT LCD) or Organic Electro Luminescence (OEL) devices have a protective film or coating disposed over elements or wiring. Such protective films serve to insulate the elements or wiring and/or to planarize device surfaces, and in some cases serve as an interlayer insulation film between multi-layered wirings. Also, such films can be used to form projections over the electrode surface for orientation control of liquid crystal molecules in LCD devices or as spacers between electrodes in OEL and LCD devices. Protective films are also useful in mounting semiconductor devices on printed wiring boards where such films serve to insulate between the semiconductor device and the circuit of the board.

To be effective, materials for such protective/insulative films must be able to withstand subsequent processing while maintaining their protective/insulative properties during the useful life of device within which they are incorporated. Where such materials are used in optical applications such as displays and/or optical semiconductor devices, the materials must also be highly transparent at appropriate wavelengths of light. In addition, for some applications, the materials must also be photosensitive. That is to say, they must be capable of being photo patterned without the need of a distinct patterning layer being applied thereover.

While in the past various materials have been found useful for some of the applications described above, the higher integration and/or miniaturization of displays, semiconductor devices and printed wiring boards has shown that the continued use of such previously known materials will be problematic and/or limiting. For example, while currently known polyimide resins generally have adequate high temperature performance, they do not have a low enough permittivity to be effective in highly integrated and/or miniaturized devices having increased wiring density and high signal speed. In addition, polyimide resins are not transparent enough for some optical applications. One such known polyimide material is the positive type photosensitive resin encompassing a polyimide precursor and a diazoquinone-type compound disclosed in Japanese Patent No. 3,262,108.

Other examples of currently known materials that are believed to problematic or limiting are the acrylic resin based radiation-sensitive composition disclosed in Laid-open Japanese Patent Application No. Hei 5-165214 and the radiation-sensitive resin composition encompassing an alicyclic olefin resin disclosed in Laid-open Japanese Patent Application No. 2003-162054. Both materials, while exhibiting adequate transparency do not have adequate in heat resistance.

Therefore it would be advantageous to have a photosensitive resin composition that can be used for forming a film that is highly transparent, has a low permittivity, is readily photo patternable and has high heat resistance. In addition, it would be advantageous for such a photosensitive resin composition to be photo patternable using an aqueous based developer such as an aqueous alkali solution.

Exemplary embodiments in accordance with the present invention will be described. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope and spirit of the present invention.

Unless otherwise indicated, all numbers, values and/or expressions referring to quantities of ingredients, reaction conditions, etc., used herein are to be understood as modified in all instances by the term "about." In addition, various numerical ranges are disclosed in this patent application. Where these ranges are continuous, they include the minimum and maximum values of the range as well as every value between such minimum and maximum values; where the ranges refer to integers; such ranges include such minimum and maximum values and every integer between such minimum and maximum values. Unless expressly indicated otherwise, the various numerical ranges specified in this specification and in the claims are approximations that are reflective of the various uncertainties of measurement encountered in obtaining such values.

As used herein, the terms "polymer" and "resin" are used interchangeably and are meant to include a synthesized polymer, as well as residues from initiators, catalysts, and other elements attendant to the synthesis of the polymer, where such residues are understood as not being covalently incorporated thereto. Such residues and other elements, considered as part of the polymer, are typically mixed or co-mingled with the polymer such that they tend to remain with the polymer when it is transferred between vessels or between solvents or dispersion media. In embodiments of the present invention, such resin is aqueous alkali soluble and encompasses repeat units having pendant acidic groups for providing such aqueous alkali solubility. Such repeat units are represented by structural Formula (1) shown below.

As used herein, the terms "photosensitive resin composition," "photosensitive polymer composition," "alkali soluble photosensitive resin composition" or "photodefinable dielectric composition" are used interchangeably and encompass a polymer resin in accordance with embodiments of the present invention as well as materials added after the synthesis of such polymer resin. Such compositions are capable of forming an insulative or dielectric layer useable in a wide variety of electrical, electronic and opto-electronic devices. As a non-limiting example, such uses include a stress buffer layer, buffer coatings, interlayer dielectric layers, passivation or protecting layers, leveling or flattening layers and redistribution layers in a wide variety of semiconductor devices, device packages, display devices, printed wiring boards and the like.

Such added materials include, but are not limited to, photosensitive materials capable of bonding with the pendant acidic group of the resin. Exemplary photosensitive materials include, but are not limited to materials encompassing a 1,2-naphthoquinonediazide-5-sulfonylic structure and/or a 1,2-naphthoquinonediazide-4-sulfonylic structure as represented by structural Formulae (Ia) and (Ib), respectively, as well as a benzoquinone diazide structure as represented in structural Formula (Ic), shown and discussed below. It will be understood that such added photosensitive materials provide for a photosensitive polymer composition that can interact with a variety of types of electromagnetic radiation, including but not limited to, ultra-violet (UV), deep ultraviolet (DUV), X-ray or electron beam radiation, upon exposure thereto.

Advantageous added materials can also include non-photosensitive materials that are capable of inducing crosslinking to both quench unreacted acidic groups and for curing the resin. Exemplary non-photosensitive materials include, but are not limited to, materials encompassing epoxy groups such as glycidyl group or the like, an epoxycyclohexyl group or the like; an oxazoline group such as 2-oxazoline-2-yl group or the like, a methylol group such as a N-hydroxy methylaminocarbonyl group or the like, or an alkoxymethyl group such as a N-methoxy methylaminocarbonyl group or the like. Generally, the aforementioned crosslinking reaction is initiated by heating to a temperature in the range of from about 130° C. to about 300° C.

As used herein, the term "cure" (or "curing") is intended to refer to a final reaction of components of the compositions in accordance with the present invention. Such curing results in achieving the desired final physical and chemical properties of the resin composition after being formed into a film or layer overlying a substrate and photo-defined. It will be understood that curing can encompass a single step or multiple steps. When processing the photodefined resin (polymer) composition, a cure encompassing multiple steps can partially cure the material in a first processing step and then "complete" the curing in a second processing step. As will be described more fully below, single step or multiple step curing can include an additional exposure to electromagnetic radiation and/or heating. Non-limiting examples of such properties include a low dielectric constant, low moisture uptake properties, appropriate modulus, coefficient of thermal expansion (CTE) and resistance to chemicals.

As used herein, the terms "low dielectric constant" or "low permittivity" refer to dielectric constant or permittivity values less than those of thermally formed silicon dioxide and in particular to materials with dielectric constant or permittivity values of less than about 3.9. The terms "low dielectric constant compositions" or "low K compositions" refer to compositions having a low dielectric constant or permittivity.

As used herein, the term "modulus" is understood to mean the ratio of stress to strain and unless otherwise indicated refers to the Young's Modulus or Tensile Modulus measured in the linear elastic region of the stress-strain curve. Modulus values are measured in accordance with ASTM method D1708-95.

As used herein, "moisture absorption" is determined by measuring weight gain of a fully cured photosensitive polymer composition in accordance with ASTM D570-98.

Polymers

As used herein, "hydrocarbyl" refers to a radical of a group that contains only carbon and hydrogen, non-limiting examples being alkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all of the hydrogens have been replaced by halogens.

As used herein, "alkyl" refers to a linear or branched acyclic or cyclic, saturated hydrocarbon group having a carbon chain length of, for example, from $C_1$ to $C_{25}$. Non-limiting examples of suitable alkyl groups include, but are not limited to, $-(CH_2)_3CH_3$, $-(CH_2)_4CH_3$, $-(CH_2)_5CH_3$, $-(CH_2)_{10}CH_3$, $-(CH_2)_{23}CH_3$ and cyclohexyl. The term "alkylol" refers to alkyl groups that include one or more hydroxyl groups.

As used herein the term "aryl" refers to aromatic groups that include, without limitation, groups such as phenyl, biphenyl, xylyl, naphthyl, anthryl and the like, as well as heterocyclic aromatic groups that include, without limitation, pyridinyl, pyrrolyl, furyl, thienyl and the like.

As used herein, "alkaryl" refers to a linear or branched acyclic alkyl group substituted with at least one aryl group, for example, phenyl, and having an alkyl carbon chain length of $C_2$ to $C_{25}$. The aryl group can be further substituted, if desired. Non-limiting examples of suitable substituent groups for the aryl group include, among others, hydroxyl groups, benzyl groups, carboxylic acid groups and aliphatic hydrocarbon groups.

As used herein, "aralkyl" refers to an aryl group substituted with at least one linear or branched acyclic alkyl group, for example, phenyl having an alkyl substituent group with a carbon chain length of $C_2$ to $C_{25}$. The aryl group can be further substituted, if desired. Non-limiting examples of suitable substituent groups for the aryl group include, among others, hydroxyl groups, benzyl groups, carboxylic acid groups, and aliphatic hydrocarbon groups. The alkyl group can be substituted with halogens.

As used herein, "alkenyl" refers to a linear or branched acyclic or cyclic hydrocarbon group having one or more double bonds and having an alkenyl carbon chain length of $C_2$ to $C_{25}$. Exemplary alkenyl groups include, but are not limited to, $-C(R^{10})=C(R^{11})-R^{12}$ where $R^{10}$, $R^{11}$ or $R^{12}$ independently represent hydrogen, a linear or branched ($C_1$ to $C_{23}$) alkyl, a linear or branched ($C_1$ to $C_{23}$) halohydrocarbyl, and a linear or branched ($C_1$ to $C_{23}$) hydrocarbyl.

As used herein, "alkynyl" refers to a linear or branched acyclic or cyclic hydrocarbon group having one or more triple bonds and having an alkenyl carbon chain length of $C_2$ to $C_{25}$. Exemplary alkynyl groups include, but are not limited to, $-C\equiv C-R^{13}$ where $R^{13}$ independently represent hydrogen, a linear or branched ($C_1$ to $C_{23}$) alkyl, a linear or branched ($C_1$ to $C_{23}$) halohydrocarbyl, and a linear or branched ($C_1$ to $C_{23}$) hydrocarbyl.

As used here and throughout the specification, mono- and multi-functional phenolics refer to the following:

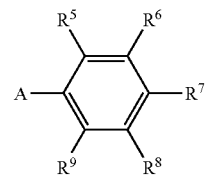

AA where in Formula AA, A is optional and if present is an oxygen, $R^5$, $R^6$, $R^7$, $R^8$, and $R^9$ independently represent hydrogen, a linear or branched ($C_1$ to $C_{25}$) alkyl, a linear or branched ($C_1$ to $C_{25}$) halohydrocarbyl, a linear or branched ($C_1$ to $C_{25}$) hydrocarbyl; and $-(CH_2)_n-O-R^*$, where n is an integer from 0 to 25, $R^*$ is H or a linear or branched hydrocarbyl or a halohydrocarbyl, with the proviso that for a mono-functional phenol only one of $R^5$ to $R^9$ is $-OH$ and for a multi-functional phenol more than one of $R^5$ to $R^9$ is $-OH$.

As used here and throughout the specification, aminophenols refer to the following:

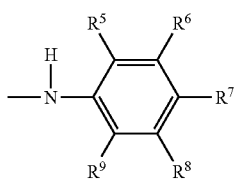

where in Formula BB, $R^5$, $R^6$, $R^7$, $R^8$, and $R^9$ are as defined for Formula AA. For some amino-phenol embodiments in accordance with the present invention at least one of $R^5$ or $R^9$ is —OH, while for other embodiments at least one of $R^5$ to $R^9$ is —OH.

Synthesized polymers or resins in accordance with embodiments of the present invention encompass a polymer backbone having repeat units in accordance with structural Formula (1):

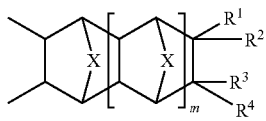

where X is selected from $(CH_2)_p$, oxygen, sulfur, or NR", p is equal to 1 or 2, R" is $C_1$ to $C_3$ alkyl; m is an integer from 0 to 5, and each occurrence of $R^1$, $R^2$, $R^3$, and $R^4$ is independently a hydrogen, a linear or branched ($C_1$ to $C_{25}$) hydrocarbyl, a linear or branched ($C_1$ to $C_{25}$) halohydrocarbyl, a linear or branched ($C_1$ to $C_{25}$) perhalocarbyl, or one of —$(CH_2)_n$—C(OH)—$(CF_3)_2$, —$(CH_2)_n$—N(H)—S(O)$_2$—CF$_3$, —$(CH_2)_n$—C(O)—OH, —$(CH_2)_n$—C(O)—$R^{31}$, —$(CH_2)_n$—O—C(O)—$R^{32}$—$(CH_2)_n$—O—$R^{32}$, and —$(CH_2)_n$—O—CHR$^{33}$—CHR$^{33}$—$R^{41}$, where n is an integer from 0 to 8, $R^{31}$ is one of a mono- or multi-functional phenol of Formula AA where A is an oxygen, an amino-phenol of Formula BB, —O—$(CH_2)_m$—C(O)—OH where m is an integer from 1 to 5, —O—$R^{33}$—C(OH)—(CF$_3$)$_2$ where $R^{33}$ a linear or branched $C_1$ to $C_6$ alkyl, or —O—(CHR$^{40}$—CHR$^{41}$—O)$_m$—$R^{42}$ where one of $R^{40}$ and $R^{41}$ is H and the other a $C_1$ to $C_3$ alkyl or both of $R^{40}$ and $R^{41}$ are H; and $R^{42}$ is $R^{32}$ as defined below or —C(O)—$R^{32}$; $R^{32}$ is one of a mono- or multi-functional phenol of Formula AA where A is not present, —$(CH_2)_m$—C(O)—OH, $R^{33}$—C(OH)—(CF$_3$)$_2$; with the proviso that for at least one type of repeat unit encompassed within the polymer backbone, at least one of $R^1$ to $R^4$ is a pendent group encompassing one of —C(OH)—(CF$_3$)$_2$, —N(H)—S(O)$_2$—CF$_3$, a mono- or multi-functional phenol, an amino-phenol or a carboxylic acid.

For some polymer embodiments in accordance with the present invention, repeat units are encompassed where at least one of $R^1$ to $R^4$ is an epoxy or oxazole function group such as represented below:

(a) an epoxy containing group of structural Formula 2:

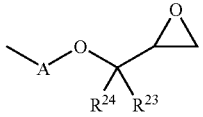

where A is a linking group selected from $C_1$ to $C_6$ linear, branched, and cyclic alkylene and $R^{23}$ and $R^{24}$ are independently selected from H, methyl, and ethyl;

(b) an epoxy containing group of structural Formula 3:

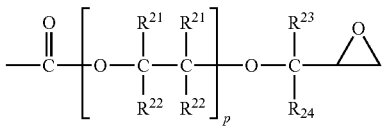

where p is an integer from 0 to 6, $R^{23}$ and $R^{24}$ are as defined above, and each occurrence of $R^{21}$ and $R^{22}$ is independently selected from H, methyl, and ethyl;

(c) any combination of two of $R^1$, $R^2$, $R^3$, and $R^4$ linked together by a linking group selected from $C_1$ to $C_{25}$ linear, branched, and cyclic alkylene and alkylene aryl; wherein n is an integer of from 1 to 25, an epoxy containing group of structural Formula 2 as defined above. In the inventive copolymer, a portion of the repeat units having structural Formula 1 contain at least one epoxy functional pendant group; and (d) an aromatic, linear or branched hydrocarbyl, halohydrocarbyl or perhalocarbyl moiety terminated by one of

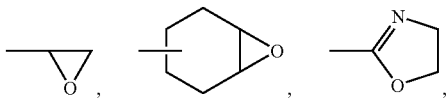

and —$R^{25}$—CH$_2$—O—$R^{26}$ where $R^{25}$ is arylene or —N($R^{27}$), where $R^{27}$ is a hydrogen, a linear or branched ($C_1$ to $C_4$) hydrocarbyl, and $R^{26}$ is a hydrogen, a linear or branched ($C_1$ to $C_4$) hydrocarbyl, with the proviso that at least one of $R^1$, $R^2$, $R^3$, and $R^4$ is terminated with one of

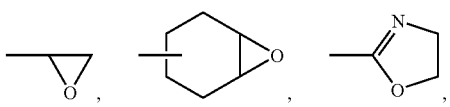

and —$R^{25}$—CH$_2$—O—$R^{26}$; where those of $R^1$, $R^2$, $R^3$, and $R^4$ not selected from the groups of (a), (b), (c) or (d) are independently a hydrogen or a linear or branched ($C_1$ to $C_{25}$) hydrocarbyl, with the proviso that where the polymer has only a first and a second type of repeat unit and where one of such repeat units is an epoxy group, the other of such repeat units does not have a pendent group encompassing a carboxylic acid group.

Some exemplary embodiments of alkali soluble resins in accordance with the present invention can encompass a polymer containing 5-95 mol % of a first repeat unit of structural Formula 1, wherein one of $R^1$, $R^2$, $R^3$ and $R^4$ is one of $-(CH_2)_n-C(OH)-(CF_3)_2$, or $-(CH_2)_n-N(H)-S(O)_2-CF_3$, the others being H, and 95-5 mol % of a second repeat unit of structural Formula 1, wherein one of $R^1$, $R^2$, $R^3$ and $R^4$ is selected from a pendent group encompassing a mono- or multi-functional phenol, an amino-phenol or $-(CH_2)_n-C(O)OH$. Other exemplary embodiments can encompass three or more types of repeat units where the first and second repeat units are as defined above; such other embodiments, can encompass a repeat unit having an epoxy or oxazole pendent group as defined above.

Monomers

Polymers encompassing repeat units in accordance with Formula 1 are generally referred to as "norbornene-type" or "NB-type" polymers, where the abbreviation "NB" is used to refer to norbornene. Such synthesized polymers or resins are generally formed by vinyl-addition polymerization of one or more appropriate polycyclic olefin monomers such as are represented by structural Formula (4):

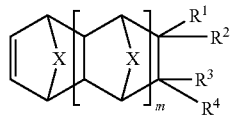

(4)

where X, p, m and each occurrence of $R^1$, $R^2$, $R^3$, and $R^4$ are as defined in Formula (I).

In some advantageous embodiments of the present invention, the synthesized resin is a vinyl-addition polymer derived from a monomer represented by Formula (5) and a monomer selected from one or more of Formulae (6), (7) or (8) shown below:

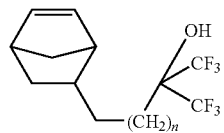

(5)

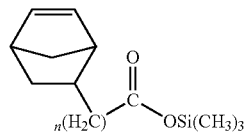

(6)

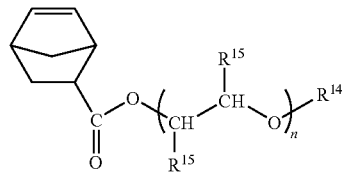

(7)

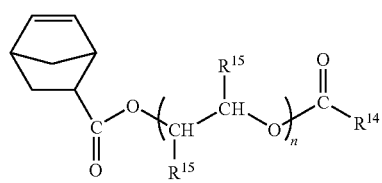

(8)

where n is an integer from 0 to 10, respectively; $R^{15}$ is optional and where present is selected from a linear or branched $C_1$ to $C_{25}$ alkyl, cycloalkyl, alkenyl, alkynyl, aryl or aralkyl group with the proviso that only one of $R^{15}$ can be present, and $R^{14}$ is selected from hydrogen, a linear or branched $C_1$ to $C_{25}$ alkyl, cycloalkyl, alkenyl, alkynyl, aryl or aralkyl group and a $C_2$ to $C_{12}$ monovalent organic moiety having an acidic group therein. It will be understood that when such monomers are used to form polymers in accordance with embodiments of the present invention, such monomers become repeat units of the polymer (Formulae 5a-8a) via a 2,3 enchainment mechanism.

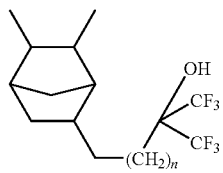

(5a)

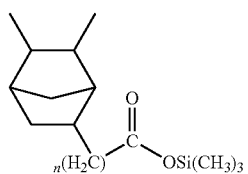

(6a)

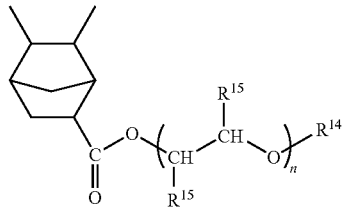

(7a)

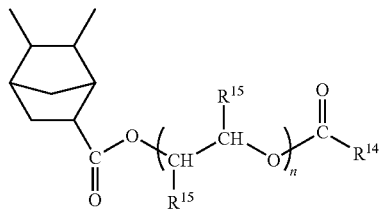

(8a)

Also it should be pointed out that the various carboxylic acid norbornene monomers represented by Formula 4 can be polymerized without providing a protecting or blocking group for the acidic hydrogen. However it is generally advantageous to employ a monomer having a blocking group substituted for such ionizable hydrogen atom to improve polymer yield. Such a protected acid is generally, readily hydrolysed to re-introduce the ionizable hydrogen after the polymerization is complete, In some embodiments such re-introduction occurs during a workup procedure. Exemplary blocking or protecting groups are generally one of a tertiary butyl group, a tertiarybutoxycarbonyl group, a tetrahydropyran-2-yl group, a trialkylsilyl group such as a trimethylsilyl group (see, Formulae 6 and 6a) or the like, a methoxymethyl group or the like.

Catalysts

Appropriate catalysts for the vinyl-addition polymerization of monomers of the present invention are coordination polymerization catalysts such as nickel or palladium compounds, or radical polymerization initiators such as 2,2'-azo-bisisobutyronitrile (AIBN), benzoyl peroxide, lauryl peroxide, azobisisocapronitrile, azobisisocapronitrile, t-butyl peroxide or the like. Advantageous nickel and palladium catalysts are disclosed in U.S. Pat. Nos. 6,790,579 B1 and 6,903,171 B2. Advantageous radical polymerization initiators and techniques of such polymerizations are disclosed in the *Encyclopedia of Polymer Science*, John Wiley & Sons, 13, 708 (1988).

Generally, where a radical initiated polymerization is employed, the monomer(s) and an initiator are dissolved in a solvent and the temperature of the monomer solution is raised from about 50° C. to about 150° C. and maintained there until polymerization is completed.

Where a nickel compound is employed as a vinyl-addition polymerization catalyst, such compound is generally represented by Formula (A):

$$E_{n'}\cdot Ni(C_6F_5)_2 \quad (A)$$

where n' is 1 or 2, and E is a ligand that donates two electrons. If n' is 1, E is generally a π arene ligand such as toluene, benzene, mesitylene or the like. If n' 2, E is selected from THF (tetrahydrofuran), ethyl acetate (EtOAc) or dioxane. Exemplary nickel compounds that can be used include, but are not limited to, (toluene)bis(perfluorophenyl)nickel, (mesitylene)bis-(perfluorophenyl)nickel, (benzene)bis(perfluorophenyl)nickel, bis(tetrahydro)bis(perfluorophenyl)nickel, bis(ethylacetate)bis (perfluorophenyl)nickel, bis(dioxane)bis(perfluorophenyl)nickel or the like.

The vinyl-addition polymerization of monomers in accordance with the present invention is generally carried out by forming a solution of such monomers in a hydrocarbon or aromatic solvent at a first temperature and then adding an appropriate amount of a desired nickel or palladium based catalyst. Optionally the solution may then be raised to a second temperature, higher than the first temperature to cause the polymerization to begin. Generally for palladium based catalysts the first temperature ranges from about 0° C. to 120° C. with a second temperature ranging from 60° C. to 120° C., and typically from 70° C. to 90° C. For nickel based catalysts the analogous first and second temperature ranges are from −25° C. to 70° C., 0° C. to 60° C. and 20° C. to 50° C., respectively.

Palladium procatalysts suitable for the polymerization of the monomers of the present invention may be represented by the following Formula (B):

$$(Allyl)Pd(P(R^x)3)(L') \quad (B)$$

where $R^x$ is selected from isopropyl and cyclohexyl; and L' is selected from trifluoroacetate and trifluoromethanesulfonate (triflate). Representative procatalyst compounds in accordance with such formula include, but are not limited to, (allyl) paladium-(tricyclohexylphosphine)triflate, (allyl)palladium (triisopropylphosphine)triflae, (allyl)-palladium (tricyclohexylphosphine)trifluoroacetate, and (allyl) palladium (triisopropyl-phosphine)trifluoroacetate.

Other suitable procatalysts are described in the aforementioned '171 patent and still others encompass a palladium metal cation and a weakly coordinating anion as represented by Formula C shown below:

$$[(E(R)_3)_a Pd(Q)(LB)_b][WCA]_r \quad (C)$$

where $E(R)_3$ represents a Group 15 neutral electron donor ligand where E is selected from a Group 15 element of the Periodic Table of the Elements, and R independently represents hydrogen (or one of its isotopes), or an anionic hydrocarbyl (and its deutero versions) containing moiety; Q is an anionic ligand selected from a carboxylate, thiocarboxylate, and dithiocarboxylate group; LB is a Lewis base; WCA represents a weakly coordinating anion; a represents an integer of 1 or 2; and b represents an integer of 1 or 2 where the sum of a+b is 3.

Representative cocatalyst compounds include, among others, lithium tetrakis(pentafluorophenyl)borate (LiFABA) and N,N-dimethylaniliniumtetrakis-(pentafluorophenyl)borate (DANFABA). Other suitable activator compounds are also described in the aforementioned '171 patent.

In accordance with some embodiments of the present invention, procatalyst to cocatalyst molar ratios can range from about 1:1 to about 1:10. In some embodiments, such molar ratios are from about 1:1 to about 1:7, and in other embodiments from about 1:2 to about 1:4. It should be recognized that appropriate molar ratios will vary depending, among other things, on the activity of a particular catalyst system, the reactivity of the monomer selected, molecular weight of the resulting polymer that is desired and the nature of the catalysts system employed. Therefore while exemplary ranges for procatalyst to cocatalyst are provided, other ranges may be found advantageous after routine experimentation and thus such other ranges are within the scope and spirit of embodiments of the present invention. For example, where a single component catalyst system is used, some embodiments of the present invention may not employ additional cocatalyst.

Generally, a solvent represents from about 50 to about 90 percent of a polymerization reaction medium, although other amounts are also found suitable. Suitable polymerization solvents for the addition polymerization reactions include hydrocarbon and aromatic solvents. Exemplary hydrocarbon solvents include, but are not limited to, alkanes and/or cycloalkanes such as pentane, hexane, heptane and cyclohexane. Exemplary aromatic solvents include, but are not limited to, benzene, hexene, toluene, xylene and mesitylene. Other appropriate solvents include halogenated alkane solvents such as dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, and 1-chloropentane; esters such as ethylacetate, i-amylacetate; ethers such as THF, 1,4-dioxane, and diethylether; aromatic solvents such as benzene, xylene, toluene, mesitylene, chlorobenzene, and o-dichlorobenzene, Freon® 112 halocarbon solvent. Mixtures of one or more of the aforementioned solvents can also be useful.

An advantageous molar ratio of monomer to either nickel or palladium catalyst is from about 50000:1 to about 10:1 while generally a ratio from about 20000:1 to 20:1 is employed. More specifically, palladium catalyst molar ratios range from 10000:1 to 500:1 with from 3000:1 to 1000:1 being typical, and nickel catalyst ratios range from 500:1 to 10:1 with from 100:1 to 20:1 being typical.

The polymer compositions of the embodiments in accordance with the present invention that are set forth herein are prepared by addition polymerization in the presence of a single or multi-component Group VIII transition metal catalyst. Such multi-component catalysts are generally prepared in situ by combining a procatalyst with a cocatalyst (or activator) in the presence of the monomer(s) to be polymerized. The term procatalyst will be understood to mean a Group VIII transition metal, generally palladium, containing compound that is converted to an active catalyst by a reaction with a cocatalyst or activator compound. Single component catalysts, on the other hand, are generally prepared by admixing appropriate catalyst precursors in an appropriate solvent, allowing the reaction to proceed under appropriate temperature conditions, and isolating the catalyst product. For example, a Group 10 metal procatalyst can be admixed with a Group 15 electron donor compound and/or a labile neutral electron donor compound, and a salt of a weakly coordinating anion in an appropriate solvent to yield a preformed catalyst complex. In some embodiments in accordance with the present invention it has been found advantageous to employ a single component catalyst with the addition of excess cocatalyst to enhance reactivity and yields. The description and synthesis of representative procatalysts and cocatalysts, as well as cationic Pd(II) catalysts formed thereusing, are known from at least the aforementioned U.S. Pat. No. 6,903,171 B2.

Polymerization

Polymer compositions in accordance with embodiments of the present invention are carried using either a batch polymerization process where a reaction initiator is added to a solution encompassing the monomers or a metered polymerization process (also referred to as semi-batch) where one or more of the monomers are added to a reaction initiator at predefined rates.

Where a nickel based catalyst system is employed, batch polymerization embodiments have the monomers premixed in a solution and the out by adding a solution of the preformed catalyst or individual catalyst components to a solution of the norbornene-type monomers along with chain transfer agent or mixtures of monomers to be polymerized and chain transfer agent (CTA). In one embodiment, the procatalyst solution was added to a solution consisting of the monomers, CTA and cocatalyst or activator. In another embodiment, the procatalyst solution was premixed with the cocatalyst or activator solution before introducing into a solution of monomer and CTA. In some embodiments, the amount of monomer dissolved in the solvent ranges from about 5 to about 50 weight percent (wt %), and in other embodiments from about 10 to about 30 wt %, and in still other embodiments from about 10 to about 20 wt %. After the preformed catalyst or catalyst components are added to the monomer solution, the reaction medium is agitated (e.g. stirred) to ensure complete mixing of catalyst and monomer components and is generally heated for a period of time adequate for the polymerization.

In a batch type solution polymerization, a mixture of the monomers, CTA and the solvent of choice is combined together in a single pot. To this mixture, the activator and procatalyst solutions are introduced together or separately.

Alternatively, the solution polymerization process can be carried out as a semi-batch process. In this process, one of the monomers or a partial mixture of the monomers is present in the reaction pot along with the CTA, procatalyst and activator solutions, at temperature. The remainder of the monomer mixture is then introduced into the reaction pot (using syringe pumps) over a period of time. In another embodiment, a portion of the CTA or all of the CTA can be introduced into the reaction pot over a period of time along with the monomer or mixture of monomers.

In some embodiments, the time of the introduction ranges from 1 minute to over 24 hours and in other embodiments, from about 1 hour to 16 hours and in still other embodiments, from about 4 hours to 9 hours.

Advantageously, the molecular weight of the resins formed in accordance with embodiments of the present invention, are readily controlled. Where nickel or palladium compounds are employed, it is found that changing ratio of catalyst to monomer can also serve to control the resulting resin's molecular weight. In addition, when a nickel catalyst is used, it has been found that the use of a chain transfer agent, such as is disclosed in U.S. Pat. No. 6,136,499, incorporated herein by reference, is effective in controlling the molecular weight of the resulting resin. Exemplary chain transfer agents encompasses generally simple α-olefins such as 1-hexene, or the like, as well as non-olefinic materials, hydrogen, alkylsilanes such as triethylsilane, alkylalkoxysilanes and the like, such as are disclosed in U.S. Published Patent Application No. 20040229157, the pertinent parts of which are incorporated herein by reference.

It is advantageous for the molecular weight of polymers (resins) in accordance with embodiments of the present invention to generally be from about 5,000 to about 100,000, although other ranges such as from about 6,000 to about 80,000, and from about 8,000 to about 60,000 are advantageous. It will be understood that while these ranges of molecular weights have been determined to be advantageous by experimentation and resins in accordance with the present invention have been found to have an acceptable balance of the optical processing thereof (photoimagability), and form films with desirable physical and mechanical properties, other ranges of molecular weight may also be found to be advantageous upon further experimentation. Therefore such other ranges are within the scope and spirit of the present invention. The weight average and number average molecular weights (in Daltons) of polymers are measured by using gel-permeation chromatography (GPC) based on polystyrene standards (implemented in relation to ASTMDS3536-91). Polydispersity Index (Mw/Mn), also referred to as PDI, of the polymers in accordance with the present invention is generally 5 or less, often 3 or less and in some embodiments 2 or less.

Isolation of the polymer product after the polymerization reaction has been completed can be accomplished by one of several methods. In some embodiments in accordance with the present invention a peracetic acid solution is prepared in situ by adding glacial acetic acid, hydrogen peroxide, and DI water to a cooled polymerization reaction mixture. This mixture is then agitated for several hours, the aqueous layer removed and the solvent layer, containing the polymer, washed with an excess of deionized water (DI water) until the pH of the washes is about 7. The polymer product is then precipitated by adding the solvent phase to an excess of hexanes, isolated by filtration and dried. In other embodiments, after the in situ peracetic acid treatment and water washes, excess amount of hexanes along with a certain amount of methanol and water are introduced into the toluene polymer solution. The polymer is now in methanol/water phase. By adding polymer solution into agitating DI water drop wise, polymer is precipitated, filtered, and dried in a vacuum oven.

In some embodiments where a Pd initiated polymerization is performed an optional quenching step is employed. Thus, at the end of a predetermined reaction time, a large excess of a phosphine complexing agent, non-limiting examples of which include bis(2-diphenylphosphino ethyl)phenyl phosphine (TRIPHOS) and trioctyl phosphine, is introduced into the reaction mixture, generally at the reaction temperature, to quench the catalyst. Generally, after the phosphine addition, the reaction mixture is maintained at the reaction temperature with agitation for a period of time ranging from about 30 minutes to about 4 hours, although other appropriate time periods can be used, before proceeding with steps to isolate the polymer product, such as by the method described above.

It should be realized that there are many possible methods for isolating the polymer product of the embodiments in accordance with the present invention, and that the exemplary methods provided herein are not limiting. Rather they are provided as a "jump-off" point for one of skill in the art to determine an appropriate isolation method for a specific polymer product. One advantageous, optional, workup process, generally referred to as "CO treatment," encompasses treating a polymer solution, e.g., a toluene and THF solution, under a carbon monoxide atmosphere for a predetermined time and at a predetermined temperature, a further option is including a mixture of acetic acid and hydrogen peroxide with such treatment. An exemplary time and temperature are about one hour and about 80° C.; other times and temperatures are also appropriate and readily determined by routine experimentation. Following this treatment, the liquid phases are allowed to separate and the polymer phase is filtered and the filtrate further treated with hexanes, methanol and water as described above.

As previously mentioned, a photosensitive material is incorporated in the photosensitive resin compositions of the present invention. Generally such materials encompass a 1,2-naphthoquinonediazide-5-sulfonylic structure and/or a 1,2-naphthoquinonediazide-4-sulfonylic structure represented in structural Formulae (Ia) and (Ib), respectively:

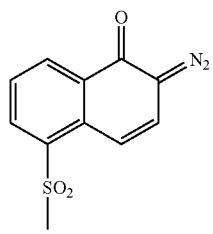

Ia

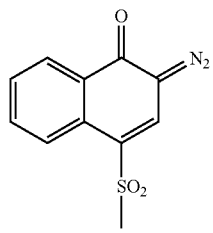

Ib and benzoquinone diazide materials as represented in structural Formula (Ic):

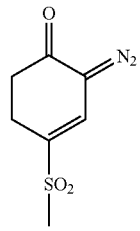

Ic

Generally the structures of Formulae (Ia), (Ib) and/or (Ic) are incorporated into the photosensitive composition as an esterification product of the respective sulfonyl chloride (or other reactive moiety) and a phenolic compound, such as one or more of the exemplary compounds represented below. Thus, any one, or any mixture of two or more of such esterification products are combined with the resin in forming the photosensitive resin compositions of the present invention. In each of Formulae (9), Q represents any of the structures of Formulae Ia, Ib or Ic. Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally such photosensitive materials are incorporated into the composition in an amount from 1 to 50 parts by weight material to 100 parts by weight resin. Where the specific ratio of the photosensitive material to resin is a function of the dissolution rate of exposed portions as compared to unexposed portions and the amount of radiation required to achieve a desired dissolution rate differential. Advantageous photosensitive materials useful in some embodiments in accordance with the present invention are shown in Formulae 9a-9d below; additional useful photosensitive materials are shown in Formulae 9e-9n below; and still other useful photosensitive materials are shown collectively as Formulae 9x, 9y and 9z:

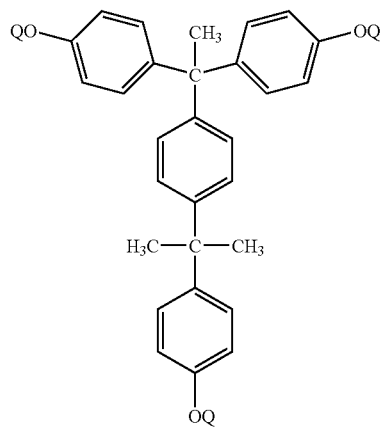

9a

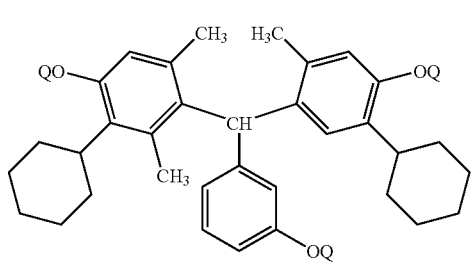

9b

-continued
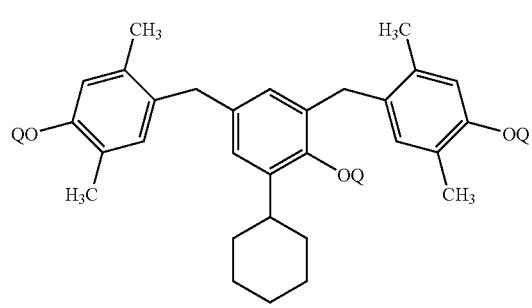
9c
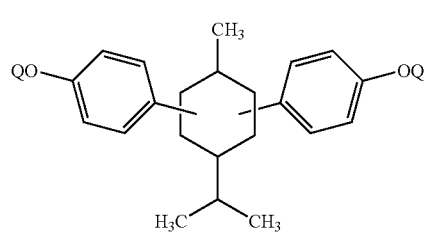
9d
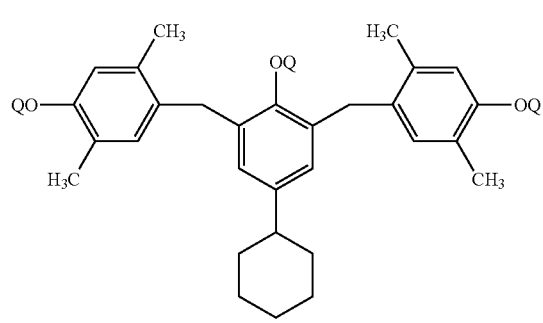
9e
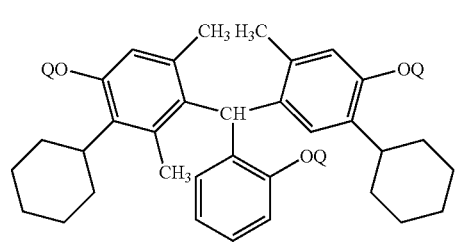
9f
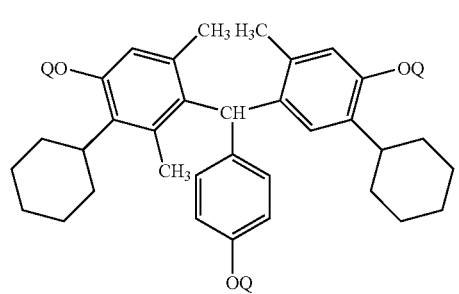
9g
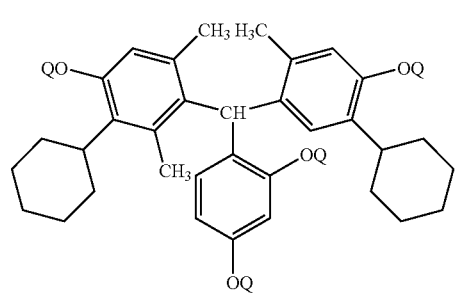
9h
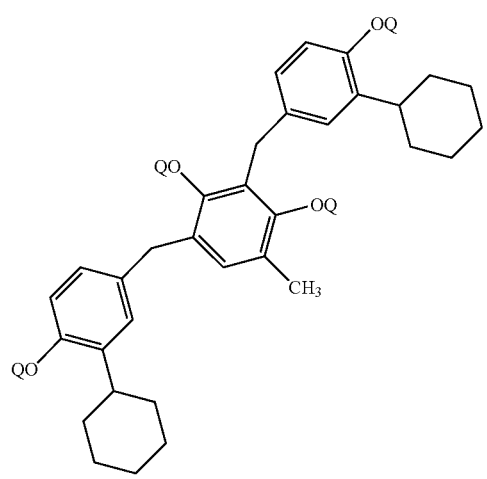
9i
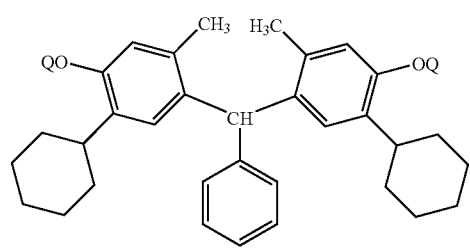
9j
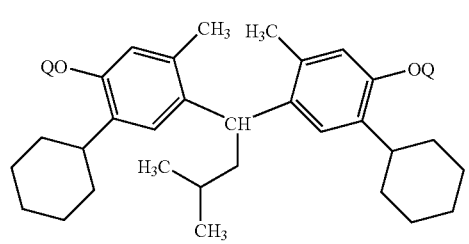
9k
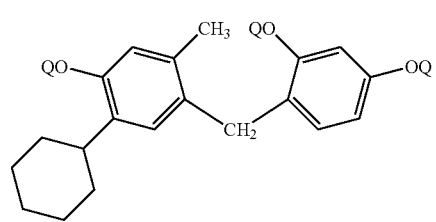
9l -continued
9m
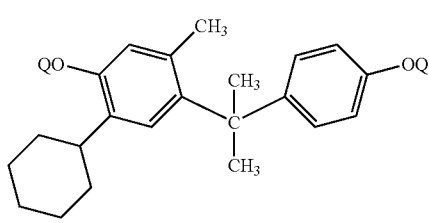
9n
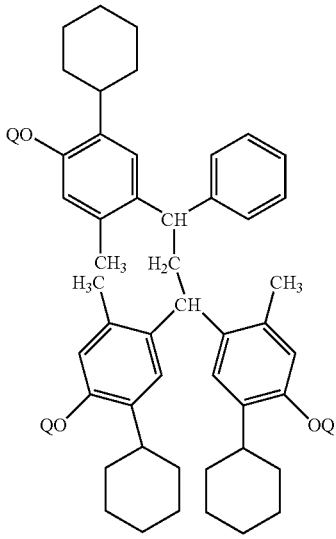
Collective Formulae 9x
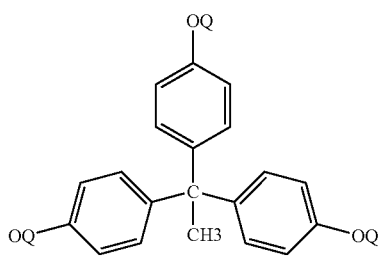
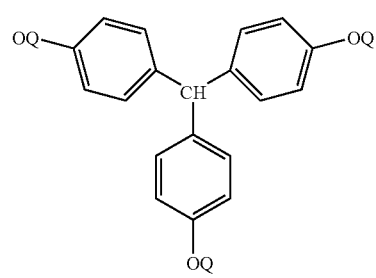
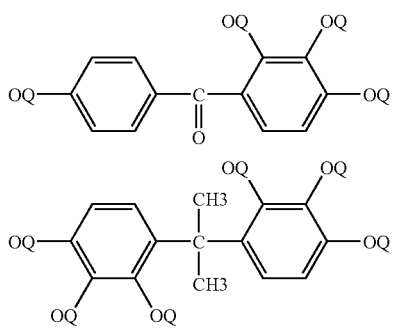
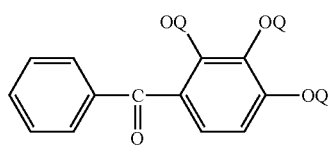
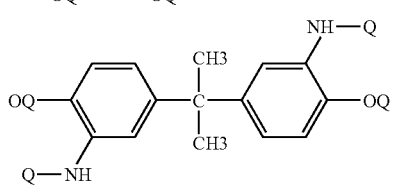
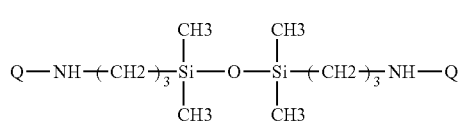
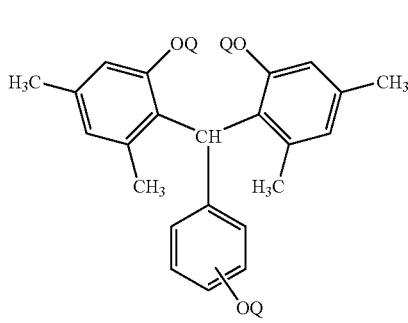
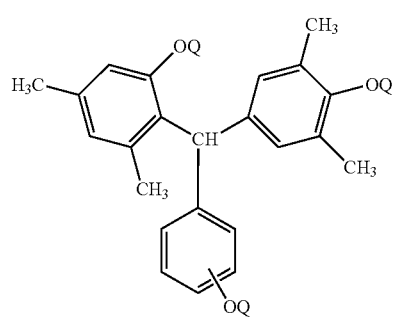

-continued
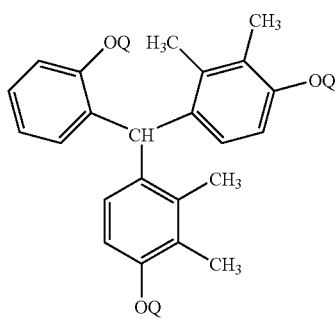
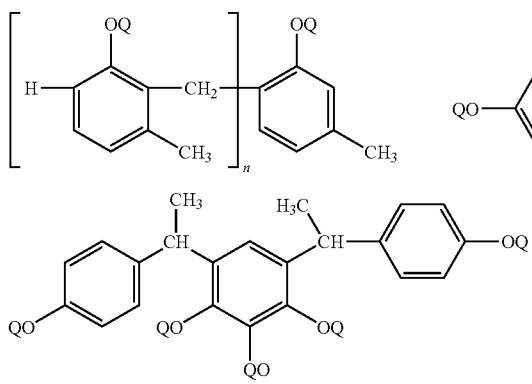
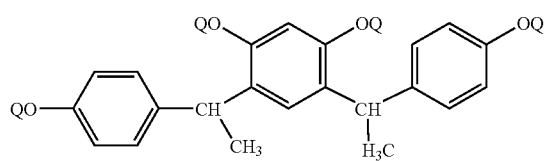
Collective Formulae 9y
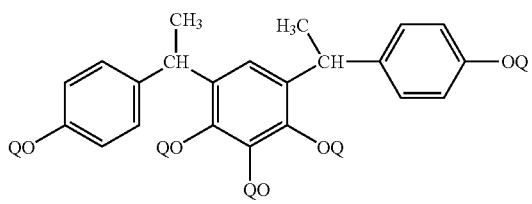
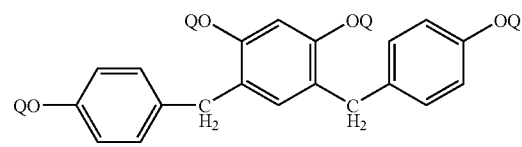
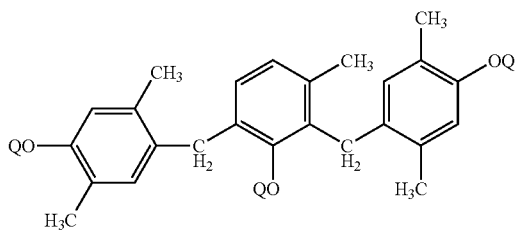
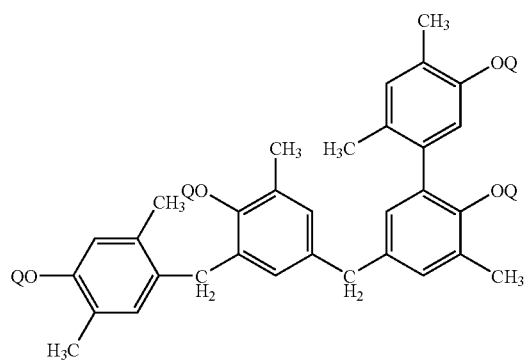
Collective Formulae 9z
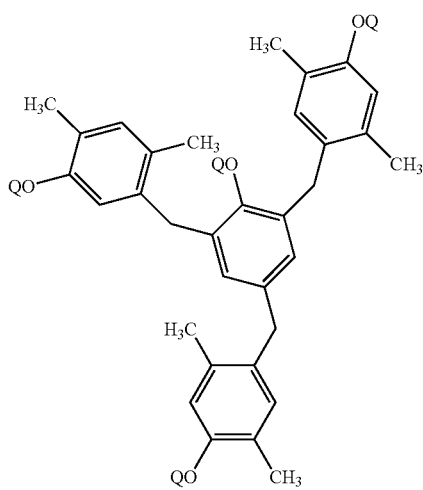
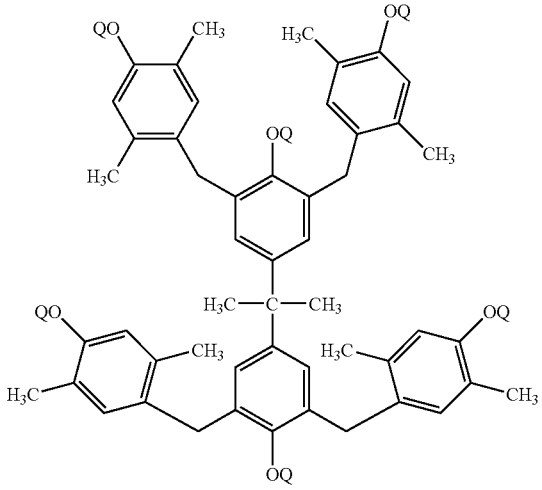

-continued

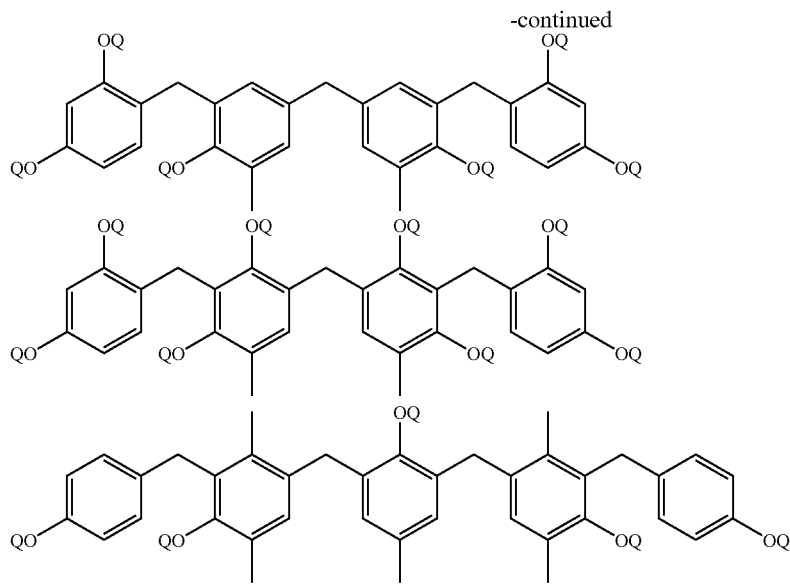

Compositions of the present invention also include materials that are advantageously capable of bonding with the pendant acidic group of the resin. Such materials include, but are not limited to, epoxy groups such as glycidyl group or the like, an epoxycyclohexyl group or the like; an oxazoline group such as 2-oxazoline-2-yl group or the like, a methylol group such as a N-hydroxy methylaminocarbonyl group or the like, or an alkoxymethyl group such as a N-methoxy methylaminocarbonyl group or the like. Generally, the aforementioned bonding with the pendant acid group of the resin is a cross-linking reaction that is initiated by heating to a temperature above 130° C. but generally less than 300° C.

Other exemplary materials capable of cross-linking (cross-linkable) with the pendant acidic group include bisphenol A epoxy resin, bisphenol F epoxy resin, silicone containing epoxy resins or the like, propylene glycol diglycidyl ether, polypropylene glycol diglycidyl ether, glycidyloxypropyltrimethoxy silane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis(2-oxazoline), 2,6-bis(4-isopropyl-2-oxazoline-2-yl)pyridine, 2,6-bis(4-phenyl-2-oxazoline-2-yl)pyridine, 2,2'-isopropylidenebis (4-phenyl-2-oxazoline), (S,S)-(−)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol, resole type phenol resin or the like. Additionally, such materials can be employed singly or as a mixture of chemically compatible materials.

The amount of such cross-linkable compounds incorporated into compositions in accordance with the present invention is generally from 1 to 50 parts by weight of the alkali soluble cyclic olefin based resin, and typically from 5 to 35 parts by weight, although other advantageous amounts of such materials are also appropriate and within the scope of the present invention.

Alkali soluble photosensitive resin compositions in accordance with the present invention may contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd), a silane coupling agent such as γ-aminopropyl triethoxysilane, a leveling agent, such as γ-(methacryloyloxy propyl) trimethoxysilane, antioxidants such as Irganox® 1035 and 1076 (Ciba Specialty Chemicals), a fire retardant such as a trialkyl phosphate or other organic phosphoric compound, a plasticizer such as, poly(propylene glycol) and a crosslinking agent such as a multifunctional epoxy compound.

In the embodiments of the present invention, these components are generally dissolved in a solvent and prepared into a varnish form to be used. As a solvent, there may be used N-methyl-2-pyrrolidone, γ-butyrolactone, N,N-dimethylacetamide, dimethylsulfoxide, diethyleneglycol dimethylether, diethyleneglycol diethylether, diethyleneglycol dibutylether, propyleneglycol monomethylether, dipropylene glyco monomethylether, propyleneglycol monomethylether acetate, methyl lactate, ethyl lactate, butyl lactate, methylethyl ketone, cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate or the like. They may be used solely or mixed by optionally selecting two or more kinds.

Among them, in view of high polymer solubility and solvent removability after curing due to volatilization, propyleneglycol mono methylether, propyleneglycol monomethylether acetate, γ-butyrolactone, and cyclohexanone are preferably used.

In some embodiments of the present invention, crosslinking can be achieved by the incorporation of norbornene repeat units, into the polymer backbone, with epoxy group-containing pendent groups. This approach can potentially reduce and/or eliminate the need for an epoxy compound added to the composition such as discussed above. Such epoxy group-containing repeat units, if used, are generally included at levels ranging from 5 mol % to 50 mol % of the polymer. More specifically such levels are effective in the range of 10 mol % to 40 mol % and in some embodiments levels in the range of 15 mol % to 25 mol % can be effective. It should be realized that an appropriate level of epoxy group-containing repeat units is a function of, among other things, the physical properties desired in the polymer and/or photodefinable layers and cured layers derived therefrom.

Such polymer embodiments have excellent physical properties, particularly for use in photodefinable compositions for electrical, electronic or optoelectronic devices. Exemplary physical properties include, but are not limited to, low moisture absorption (less than 2 weight percent), low dielectric constant (less than 3.9), and low modulus (less than 3 Giga Pascal (GPa)).

The photosensitive polymer composition embodiments, in accordance with the present invention, are first applied to a desired substrate to form a film. Such a substrate includes any appropriate substrate as is or may be used for electrical, electronic or optoelectronic devices, for example, a semiconductor substrate, a ceramic substrate, a glass substrate or the like; any appropriate coating method can be employed.

Next, the coated substrate is heated to remove excess solvent, for example to from 70° C. to 130° C. for about from 1 to 30 minutes, although other appropriate temperatures and times can be used. After the heating, the film is generally imagewise exposed to an active energy beam. For embodiments of the present invention the term "active energy beam" is used as a general term for an energy beam having electromagnetic wave-like properties. Exemplary active energy beams include, X-rays, electron beams, ultraviolet or visible light or an ionizing radiation or the like. However, generally those beams having a wavelength from 200 to 700 nm are generally the most advantageous. For some embodiments, the imagewise exposure is the result of exposing through a masking element. That is an element that has some regions that block the beam from reaching the film and other regions that allow the beam to reach the film can result in an image of the masking element being formed in the film after a development process as described below.

A development process for the exposed embodiments of the present invention provides a liquid developer solution, generally an aqueous alkali solution. Such solution acts by dissolving essentially all of those regions blocked from the beam while leaving exposed regions essentially unchanged. In this manner a positive image of the making layer is formed on the substrate. Suitable liquid developers, include but are not limited to, aqueous solutions of inorganic alkalis such as sodium hydroxide, potassium hydroxide, sodium carbonate, ammonia water or the like; and aqueous solutions of organic alkalis such as 0.26N tetramethylammonium hydroxide (TMAH), ethylamine, triethylamine, triethanolamine or the like. Where an organic alkali is used, generally an organic solvent essentially fully miscible with water is used to provide adequate solubility for the organic alkali. Aqueous solutions of TMAH are well known developer solutions in the semiconductor industry. After the image is developed, the substrate is rinsed to remove excess developer solution, typical rinse agents are water or appropriate alcohols and mixtures thereof.

After rinsing, the substrate is dried and the imaged film finally cured. That is to say, the image is fixed by causing a reaction within the imaged material. Such reaction is generally a cross-linking reaction, as discussed above, that can be initiated by non-imagewise or blanket exposure of the remaining material and heating. Such exposure and heating can be in separate steps or combined as is found appropriate for the specific use of the imaged film. The blanked exposure is generally performed using the same energy source as employed in the imagewise exposure although any appropriate energy source can be employed. The heating is generally carried out at a temperature from about 130° C. to about 300° C. for from several minutes to one or more hours. However, as in addition to the composition of the photosensitive resin composition used the heating temperature and time can also be a function of the type of device being formed; other temperatures and times can also be appropriate. Thus where a polymer composition is employed as a leveling or flattening film for a display device in one instance, and as an interlayer insulation film for a semiconductor device in another instance, different temperatures and times for the instances may be found appropriate.

In some embodiments of the present invention, a semiconductor device is formed which encompasses an insulation and/or protection layer having a predetermined pattern. In these embodiments, such insulation and/or protection layer is formed from a cured product of the photosensitive resin composition according to the present invention described above.

Such semiconductor devices are produced by using embodiments of the alkali soluble photosensitive resin composition of the present invention to form layers which are characterized as having high heat resistance, low water absorption rate or the like, high transparency, and excellent property of low permittivity. In addition, such layers generally have an advantageous coefficient of elasticity after curing, 0.1 kg/mm$^2$ to 200 kg/mm$^2$ being typical.

In some embodiments of the present invention, a display device is formed which encompasses an insulation and/or protection layer having a predetermined pattern. In these embodiments, such insulation and/or protection layer is formed from a cured product of the photosensitive resin composition according to the present invention described above.

Such display devices are produced by using embodiments of the alkali soluble photosensitive resin composition of the present invention to form layers which are characterized as having high heat resistance, low water absorption rate or the like, high transparency, and excellent property of low permittivity. It will be understood, that the forming of insulation and/or protective layers of the present invention for display devices generally is accomplished by first coating a layer of photosensitive resin composition onto a display substrate, patterning the layer, performing one or more post-exposure processes, and curing the layer to obtain high transparency. While the final curing temperature of layers for semiconductor devices is as high as 280° C., for high transparency, such as in display devices, a final curing temperature of less than about 200° C. is generally desirable.

As previously mentioned, exemplary applications for embodiments of the photosensitive resin compositions in accordance with the present invention include insulation films (interlayer dielectric layers), protecting films (passivation layers), mechanical buffer films (stress buffer layers) or flattening films for a variety of display devices, semiconductor devices, printing wiring boards or the like. Specific applications of such embodiments encompass a passivation film which is formed on a semiconductor device; a buffer coat film which is formed on the passivation film; an interlayer insulation film which is formed over a circuit formed on a semiconductor device; or the like.

Upon using the photosensitive resin composition of the invention for these applications, the coefficient of elasticity of the resin composition after curing is generally from 0.1 kg/mm² to 200 kg/mm², and often from 0.1 kg/mm² to 100 kg/mm². Further, in such semiconductor applications, a thickness of the layer of the photosensitive resin composition after curing is generally from 0.1 µm to 200 µm, and often from 0.1 µm to 100 µm.

As examples of application to display device, there are an interlayer insulation film for TFT, TFT element flatting film, color filter flatting film, a projection for an MVA type liquid crystal display device, a negative electrode partition for an Organic EL element.

Specific applications of embodiments of the photosensitive resin composition of the present invention for display devices can be analogous to those described for semiconductor devices, where a polymer (resin) layer is formed on a substrate and a predetermined pattern formed in such layer. Where the substrate is a portion of a display device or color filter, it will be understood that such is formed with the use of the photosensitive resin composition.

In applying the photosensitive resin composition to the display device, especially an interlayer insulation film and a flattening film, high transparency is required. Advantageously, polymers in accordance with embodiments of the present invention are especially excellent in transparency and such excellent transparency is at least maintained by introducing the aforementioned post-exposure process upon forming the photosensitive resin composition layer.

Embodiments in accordance with the present invention therefore provide a photosensitive polymer composition which exhibits enhanced characteristics with respect to one or more of mechanical properties (such as low-stress) and at least equivalent chemical resistance and low water absorption rates, as compared to alternate materials such as polyimides. In addition such embodiments provide generally excellent electrical insulation, adhesion to the substrate, and the like. Thus semiconductor devices, device packages and display devices are provided that incorporate embodiments in accordance with the present invention.

EXAMPLES

Next, the present invention will be explained in more detail by way of the following Synthesis and Resin Layer Examples.

For the Synthesis Examples, unless otherwise noted, all preparations were performed using appropriate sized vessels and stirring apparatus that were dried for at least 12 hours in a forced air oven having a set temperature of 120° C. After drying, the vessels and stirring apparatus were immediately transferred to a glove box having a nitrogen atmosphere (nominally <10 ppm oxygen and <5 ppm $H_2O$) for cooling to ambient temperature. All solvents employed prior to polymerization were sparged for at least about 30 minutes with dry nitrogen before use. All solid polymers that were isolated were dried under vacuum at 75° C. for 24 hours before determining molecular weight (Mw and Mn) and the polydispersivity index (PDI) by GPC, against a polystyrene standard, in THF. Polymer composition was determined by $^1$H NMR analysis.

Synthesis Example 1

HFANB/Acetic Acid NB

In the glove box, a 2 L Wheaton bottle containing a magnetic stirrer bar was charged with 700 mL of the toluene, hydroxyhexafluoroisopropyl norbornene (HFANB, 169.55 g, 0.62 moles), norborene acetic acid trimethylsilylester (NBCH₂COOTMS, 30.45 g, 0.14 moles), dimethylanalinium tetrakis (pentafluorophenyl) borate (DANFABA, 0.36 g, 0.454 mmoles) and triethyl silane (3.16 g, 27.2 mmoles) and sealed with a crimp cap lid. Also in the glove box, a catalyst solution of di[(tri-isopropylphosphine) palladium(acetonitrile)acetate]tetrapentafluorophenylborate (Pd-1206, 0.61 g, 0.506 mmoles) in 10 mL of anhydrous toluene was prepared in a 30 mL crimp bottle. The crimped bottles were moved to a fume hood.

3 mL of the catalyst solution (0.183 g, 0.152 mmoles) was removed from the crimp bottle and injected into the Wheaton bottle. After the injection, the Wheaton bottle was then placed into an 80° C. oil bath and maintained therein for 18 hours, after which the bottle was removed from the oil bath and allowed to cool to ambient temperature.

After cooling, the bottle was opened and 500 mL of THF added. Next, glacial acetic acid (140 mL, Fisher), hydrogen peroxide (280 mL, 30 weight % solution in water, Fisher) and deionized water (420 mL) were added to the bottle and the resulting solution stirred vigorously for 18 hours. The mixture was allowed to separate into an aqueous phase and an organic phase after which the aqueous phase was removed. The organic phase was washed 2 times with deionized water (500 mL) and then concentrated by rotary evaporation. Polymer was precipitated by pouring the concentrated solution into excess hexanes (4 L) and recovered by filtration. After drying, 139 g (70.0% yield) of a white powder was obtained. Mw=10,528; Mn=5,586; PDI=1.89; 71 mol % HFANB and 29 mol % Acetic acid NB.

Synthesis Examples 2-5

HFANB/NBCH₂COOH

According to the method described in Example 1, a series of polymers of HFANB and NBCH₂COOH with different molar ratios were prepared. The monomer loading, amount of chain transfer agent employed, percent recovery, and polymer characterization are listed in following table.

|  | Example | | | |
| --- | --- | --- | --- | --- |
|  | 2 | 3 | 4 | 5 |
| HFANB | | | | |
| grams | 32.35 | 169.55 | 42.28 | 43.69 |
| mmoles | 119.8 | 618.3 | 154.2 | 159.3 |
| NBCH₂COOTMS | | | | |
| grams | 17.65 | 30.45 | 1.82 | 6.31 |
| mmoles | 78.7 | 135.7 | 8.2 | 28.1 |
| Triethylsilane | | | | |
| grams | 0.86 | 3.16 | 0.48 | 0.76 |
| mmoles | 7.4 | 27.2 | 4.0 | 6.5 |
| Yield | 42% | 76% | 70% | 52% |
| Mw | 11261 | 10100 | 10528 | 11025 |
| Mn | 5878 | 5060 | 5586 | 5846 |
| PDI | 1.92 | 2.00 | 1.80 | 1.89 |
| NBCH₂COOH | 55 mol % | 25 mol % | 29 mol % | 25 mol % |
| HFANB | 45 mol % | 75 mol % | 71 mol % | 75 mol % |

Synthesis Example 6

HFANB/NBCH$_2$COOH

In the glove box a 500 mL Wheaton bottle was charged with, HFANB (39.28 g, 143.0 mmoles), NBCH$_2$COOTMS (2.62 g, 11.7 mmoles), triethylsilane (0.8 g, 6.9 mmoles), DANFABA (0.255 g, 0.3 mmoles), and 140 mL of toluene and then sealed with a crimp cap lid. Also in the glove box, a catalyst solution of Pd-1206 (0.128 g, 0.1 mmol) in 4 mL of anhydrous dichloromethane was prepared in a 10 mL crimp bottle and a feed solution of NBCH$_2$COOTMS (9.64 g, 43.0 mmol) in toluene (7.72 g) was formulated in a 20 mL crimp vial. The feed solution was transferred into a 25 mL Hamilton sure-seal syringe. The two bottles and syringe were then transferred to a fume hood.

In the fume hood, the solution in the Wheaton bottle was heated, with agitation, to 80° C. in an oil bath. 4 mL of the catalyst solution was added to the Wheaton bottle and then the addition of the feed solution started using a KDS syringe pump programmed to complete the addition in 12.5 hr. After completing the addition of the feed solution heating of the reaction mixture was continued for ?? hr. and then allowed to cool to ambient temperature.

After a workup performed in a manner analogous to that described for Synthesis Example 1 (appropriate volumes were employed), 22.3 g (48% yield) of a white powder was obtained. Mw=9,141; Mn=6,062; PDI=1.51 A carboxylic acid titration showed composition of the polymer to be 71.6 mol % of HFANB and 28.4 mol % of NBCH$_2$COOH.

Synthesis Example 7

HFANB/NBCH$_2$COOH

The process of Synthesis Example 6 was followed except that 78.6 g (286.6 mmol) of HFANB, 4.71 g (mmol) of NBCH$_2$COOTMS, triethylsilane (0.4 g, mmol), and DANFABA (0.51 g, 0.64 mmol) were dissolved in 280 g of anhydrous toluene and 20 g of decane; and for the feed solution, 1.2 g of triethylsilane, 16.69 g of NBCH$_2$COOTMS were dissolved in 18.5 g of toluene in a 60 mL crimped bottle and transferred to a 50 mL Hamilton syringe.

After a workup performed in a manner analogous to that described for Synthesis Example 1 (appropriate volumes were employed), 61.4 g (65.9%) of a white powder was obtained. Mw=13820; Mn=7250; PDI=1.91. A carboxylic acid titration showed composition of the polymer to be 70.7% HFANB and 29.3% NBCH$_2$COOH.

Synthesis Example 8

HFANB/NBCH$_2$COOH

In the glove box a 125 mL Wheaton bottle was charged with HFANB (15.71 g, 57.31 mmol) and NBCH$_2$COOTMS (4.29 g, 19.10 mmol) and 60 g of anhydrous toluene. A solution of NiARF (0.74 g, 1.5 mmol) in 5 g of anhydrous EtOAc was prepared in a crimp vial. After sealing the bottle and vial, both were transferred to a fume hood where the bottle was heated to 50° C. in an oil bath for 1 hour. The NiARF solution was then injected into the bottle and the reaction mixture stirred for 4 hours while the bottle remained in the heated oil bath, after which the bottle was removed and allowed to cool to ambient temperature. The reaction mixture was diluted with 15 mL of THF and treated with a mixture of 7.5 mL of AcOH; 15 mL of H$_2$O$_2$ and 22.5 mL of DI water. After allowing phase separation, an aqueous phase was removed and a solvent phase washed with 40 mL of DI water. 60 mL of MeOH and 250 mL of hexane were added to the washed solvent phase and again after phase separation an alcohol phase was saved, washed with 200 mL of hexane and then added into 1.2 of agitating DI water to cause precipitation of the polymer. After drying, 17.2 g (90%) of a white powder was obtained. Mw=22477; Mn=12368, and PDI=1.82. Carboxylic acid titration showed 75.0% HFANB and 25.0% NBCH$_2$COOH.

Synthesis Example 9

HFANB/NBCOOH

The process of Synthetic Example 1 was followed except that a 500 mL Wheaton bottle was charged with toluene (178 mL), HFANB (46.88 g, 0.171 moles), NBCOOTMS (3.12 g, 14.85 mmoles), DANFABA (0.445 g, 0.556 mmoles) and triethylsilane (0.73 g, 6.3 mmoles); and 0.448 g, 0.371 mmoles of Pd-1206 in 20 mL of anhydrous toluene was used to prepare the catalyst solution.

10 mL of the catalyst solution (0.22459, 0.186 mmoles) was added to the 500 mL Wheaton bottle containing the monomer solution. After a workup performed in a manner analogous to that described for Synthesis Example 1 (appropriate volumes were employed), 25.04 g (50% yield) of a white powder were obtained. Mw=10,067; Mn=5,990; PDI=1.68; 92 mol % HFANB and 8 mol % NBCOOH.

Synthesis Example 10

HFANB/NBCOOH

The process of Synthesis Example 6 was followed except that the Wheaton bottle was charged with 39.82 of HFANB, 3.28 g of NBCOOTMS, 0.6 g of triethylsilane, 0.47 g of DANFABA, 140 g of anhydrous toluene and 10 g of decane. For the feed solution, 6.9 g of NBCH$_2$COOTMS and 10.8 g of toluene where added to 30 mL bottle and transferred to a 50 mL Hamilton syringe. And the catalyst solution used was Bis(dicyclohexyltbutylphosphine)palladium (acetonitrile) acetate tetrakis(pentafluorophenyl)borate (Pd-1394, 0.27 g, 0.94 mmoles) in 4 mL of dichloromethane in a 10 mL bottle.

After the addition of the catalyst, the feed solution was added over a 12 hr. schedule and then quenched by adding bis(2-diphenylphosphino ethyl)phenyl phosphine (TRIPHOS 0.44 g in 10 mL of THF) solution.

After a workup performed in a manner analogous to that described for Synthesis Example 6 (appropriate volumes were employed), 24.7 g (53.7%) of a white powder was obtained. Mw=13460; Mn=8280; PDI=1.63. A carboxylic acid titration showed composition of the polymer to be 71.4 mol % of HFANB and 28 mol % of NBCOOH.

Synthesis Example 11

HFANB/NBCOOH

The process of Synthesis Example 6 was followed except that a 5 gallon teflon lined reactor was charged with a solution of HFANB (2551.3 g, 9.30 moles), NBCOOTMS (255.3 g, 1.21 mol) in toluene (8640 g). A solution of triethylsilane (1.7 g, 14.6 mmol) in toluene (304 g) was then added to the reactor.

In a nitrogen purged glove box, separate solutions of DANFABA (31.36 g, 39.1 mmol) in 457 g of dichloromethane, Pd-1394 (18.112 g, 13 mmol) in 240 g of toluene and a feed solution of NBCOOTMS (685.3 g, 3.26 mol) in toluene (1570 g) were formulated in pressure containers and sealed.

The solution of DANFABA was added to the reactor by a nitrogen presurized feed and the resulting mixture heated to 90° C. with agitation. Upon reaching the desired temperature, the solution of Pd-1394 was added to the reactor by a nitrogen presurized feed and the metered-fed of the NBCOOTMS feed solution, programmed for completion in 8.3 hr, was started.

After the meter feed completed, a trioctyl phosphine (30.72 g) solution in 500 g of toluene was added and the mixture stirred for an additional hour at 90° C. After cooling to ambient temperature, a workup performed in a manner analogous to that described for Synthesis Example 6 (appropriate volumes were employed), 1.83 kg of a pale colored powder was collected. Mw=9111; Mn=5656; PDI=1.61. Carboxylic acid titration showed the composition of the polymer as 72.43 mol % of HFANB and 27.57 mol % of NBCOOH.

Synthesis Example 12

HFANB/NBCOOH

In a dry box, HFANB (15.93 g, 58.09 mmol) and NBCOOTMS (4.07 g, 19.36 mmol) were dissolved in 60 g of anhydrous toluene in a 125 mL crimp bottle. NiARF (0.75 g, 1.5 mmol) was dissolved in 5 g of anhydrous EtOAc. The monomer solution was transferred from the dry box to an exhaust hood and heated at 50° C. in an oil bath for 1 hour. The NiARF solution was injected into the monomer solution. The solution was stirred at 50° C. for 4 hours and then removed from the oil bath to cool to room temperature. The polymer solution was diluted with 15 mL of THF, and treated with peracetic acid: 7.5 mL of AcOH; 15 mL of $H_2O_2$; and 22.5 mL of DI water. An aqueous phase was formed and removed. 40 mL of DI water were added to wash the polymer. 60 mL of MeOH and 250 mL of hexane were added, and an alcohol phase that contained the polymer was formed. The polymer solution in MeOH was washed with 200 mL of hexane. Polymer was precipitated into 1.2 L of agitating DI water and filtered to recover the precipitated polymer. The polymer was dried under vacuum at 80° C. The yield was 17.2 g (90%). GPC indicated that the polymer had an Mw=20338, Mn=10591, and PDI=1.92. Carboxylic acid titration showed HFANB/NBCOOH=75.5/24.5.

Synthesis Example 13

HFANB/NBCOOH/AGENB

A polymer of HFANB, NBCOOTMS and allyl glycidyl ether norbornene (AGE NB), which is represented by Formula 16, was prepared as follows:

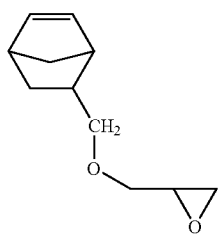

(16)

A 50 mL Wheaton bottle was prepared as in Example 2. The bottle was then charged with toluene (8 mL, Aldrich Anhydrous grade), HFANB (1.92 g, 7 mmoles), NBCOOTMS (0.32 g, 1.5 mmoles) and AGENB (0.27 g, 1.5 mmoles) and sealed with a crimp cap lid. The bottle was then removed from the glove box and the solution was sparged with dry nitrogen for 30 minutes to remove any dissolved oxygen.

In a separate 10 mL Wheaton vial, prepared as above, bis(toluene)bis(perfluorophenyl) nickel (NiARF 0.097 g, 0.20 mmoles) was dissolved in anhydrous ethyl acetate (3 mL, Aldrich) and the solution added into the 50 mL bottle. The reaction mixture was stirred on a mechanical stirring plate at ambient temperature for 18 hours.

The bottle was then opened and glacial acetic acid (2 mL, Fisher), hydrogen peroxide (4 mL, 30 weight % solution in water, Aldrich) and deionized water (2 mL) added. The resulting solution was stirred vigorously for 30 minutes and then ethyl ether (5 mL, Aldrich) was added. The aqueous phase was allowed to separate and then decanted. The organic phase was washed 3 times with deionized water (5 mL) to remove any residual acid and then poured into excess hexane (50 mL) to precipitate the polymer. Solid polymer was recovered by filtration and dried under vacuum at 50° C. for 8 hours to recover 1.88 g (78% yield) of a white powder. Mw=50,550 Mn=25,840 PDI=1.96. The composition of the polymer was found to be 70 mol % HFANB and 15 mol % NBCOOH and 15 mol % AGE NB.

Synthesis Example 14

HFANB/NBCH$_2$CH$_2$COOH

A polymer of HFANB and propionic acid norbornene (NBCH$_2$CH$_2$COOH) was prepared as follows. HFANB (16.79 g, 61.25 mmol.), norbornene propionic acid trimethylsilylester (NBCH$_2$CH$_2$COOTMS) (3.21 g, 13.45 mmol.), triethyl silane (0.31 g, 2.69 mmol.), DANFABA (0.18 g, 0.22 mmol.), decane (4.0 g) and toluene (56.0 g) were weighed into a 100 mL bottle in a nitrogen dry box. Before removing the bottle from the dry box, the bottle was crimp capped to maintain an inert atmosphere. The bottle was then placed in an oil bath maintained at 90° C. After 30 minutes, once the reaction mixture had reached an equilibrium temperature, the catalyst solution was injected into the reaction flask. The catalyst solution consisted of Pd-1206 (0.09 g, 0.07 mmol.) dissolved in 1 mL of dichloromethane. The reaction was allowed to proceed at temperature for 15 minutes, following which the reaction was terminated using 0.2 g of trioctyl phosphine (TOP).

The above mentioned polymer solution, was mixed with 48 mL of methanol, 180 mL of hexanes and 2.4 ml of distilled water. The mixture was shaken in a separatory funnel. The polymer-methanol layer separated from the hexanes-toluene layer. The polymer-methanol layer was collected and washed with 300 mL of hexanes an additional two times. The polymer-methanol solution was then precipitated into 700 mL of deionized water. The precipitates were collected by filtration, air dried at room temperature for an hour and then redissolved in a mixture of toluene/THF (90 mL/12 mL). This solution was transferred to a glass reactor, along with 0.9 mL of acetic acid, 1.8 mL of $H_2O_2$. The sealed glass reactor was charged up with carbon monoxide (80 psi) and heated to 80° C. for a period of 6 hours.

The solution was then filtered through a 0.22 micron Teflon filter. The resulting filtrate (light yellow color) was extracted with 48 mL of methanol and 180 mL of hexanes. The resulting polymer solution in methanol was precipitated into deionized water (700 mL). The solids were filtered off and vacuum dried at 80° C. for 16 hours.

Polymer yield was 13.2 g (66%). The composition as determined by acid number titration was HFANB/NBCH$_2$CH$_2$COOH 79.2/20.8 mol %. Mw of 11258 and a Mn of 6804.

Synthesis Example 15

TFSNB/NBCH$_2$CH$_2$COOH

A polymer TFSNB and proprionic acid NB was prepared as follows. TFSNB 11.44 g, 45 mmol, proprionic acid NB (NBCH$_2$CH$_2$COOH) 3.56 g, 15 mmol. and dry toluene (45 g) were combined into a glass bottle equipped with a stir bar in a nitrogen atmosphere dry box. The bottle was sealed using a crimp cap in the dry box. In another bottle NiArF was weighed out (1.12 g, 2.4 mmol.) and dissolved into 10 mL of dry toluene. The bottle containing the monomers was placed on a stir plate. With vigorous agitation, the NiArF solution was added into the monomer solution. The reaction was allowed to stir for 30 minutes at room temperature, following which the reaction was terminated using 20 mL of THF. The solution was then treated with 20 g of IRC-718 resin overnight. The solution was diluted further with THF and the resin material filtered off. The polymer was isolated by precipitation into a large excess of hexanes.

A white polymer was isolated by filtration and drying at 80° C. under vacuum for 12 h. Polymer obtained was 6 g (40% yield). Composition of polymer was found to be TFSNB/NBCH$_2$CH$_2$COOH 67/33. Mw of 26,123 and a Mn of 16,298.

Example 16

NBCOOH/NBamidophenol

A copolymer of norbornene carboxylic amidophenol and norbornene carbocylic acid was prepared as below. To a polynorbornene carboxylic acid (7.5 g) in 75 g of anhydrous THF in a 250 mL flask cooled in an ice bath, 9 g of oxalyl chloride was added dropwise in 3 min. After the ice batch was removed, the reaction mixture was stirred at room temperature for 3 h. Then solvent and excess oxalyl chloride were removed under vacuum. After the polynorbornene acid chloride dissolved in 100 g of anhydrous THF, 6.75 g of o-aminophenol in 47.5 g of DMF is added to the polymer solution. The reaction temperature was then brought to 60 C. The reaction mixture was then stirred at the temperature for 2 h. The cooled polymer solution was then pour into a solvent mixture of 1600 mL of MeOH and 200 mL of H$_2$O to precipitate polymer. After filtered and dried, the polymer was collected in a yield of 7.5 g. Mw=20525 Mn=9940 PDI=2.07. The polymer composition was found to be NB amidophenol=69 mol %, and NBCOOH=31 mol %

Resin Layer Examples 1-32

In the following Resin Layer Examples 1-32 photosensitive resin compositions were prepared, using the following photosensitive materials:

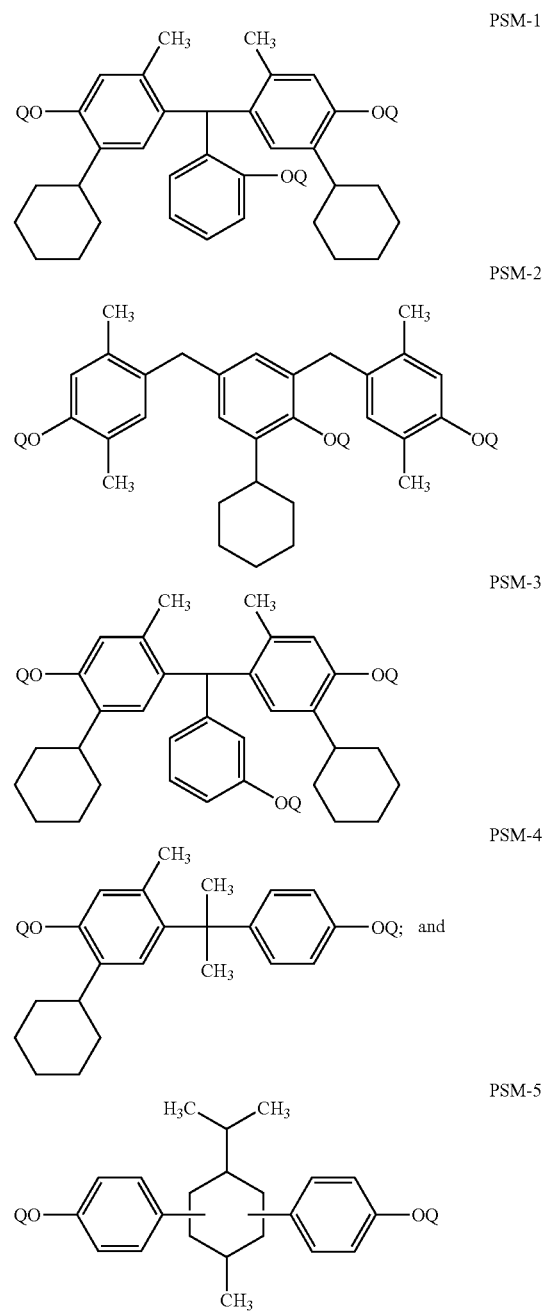

where in each of PSM-1 to PSM-5, Q is a hydrogen atom or

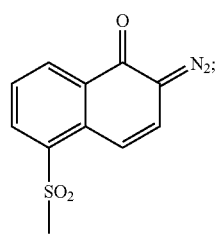

with the proviso that at no more than 10% of all Q are a hydrogen atom.

For the Resin Layer Examples, unless otherwise noted, all preparations and subsequent application to a substrate were performed under yellow light.

In each of Resin Layer Examples 1-4, after formulating the photosensitive compositions, each was applied to a glass substrate by spin coating. The substrate was then placed on a 100° C. hot plate for 1 minute (min) and a resulting resin layer, nominally 2 µm thick obtained. Each substrate supported layer was imagewise exposed through a masking element for 10 seconds (sec) using a CANON PLA-600 mask aligner and an exposure intensity of 25 mW/cm2. The substrate supported layers were then immersed in a 2.38% tetramethylammoniumhydroxide (TMAH) aqueous solution for 25 sec to remove exposed portions of the layer and form a positive image of the masking element. After drying, the patterned layers were flood exposed at an exposure intensity of 25 mW/cm2 for 40 seconds and finally dried/cured for 1 hour (hr) in a forced air convection oven having a set temperature of 200° C.

In each of the Resin Layer Examples 5-33, a photodefinable resin composition was prepared as follows. Solid polymer was placed in a 25 mL polyethylene bottle and 18 g of propyleneglycol monomethylether acetate was added. The bottle was sealed and the polymer was uniformly dispersed by an appropriate means 20.0 g of polymer solution was weighed into a 50 mL amber polyethylene bottle and appropriate additives, identified in the specific Resin Layer Examples that follow, were added. After this addition, the solution was mixed for 5 hours to dissolve the additives in the polymer solution and then filtered through a 0.2 µm Teflon® filter.

Each photodefinable composition of Resin Layer Examples 5-33 was imaged and cured, unless otherwise noted, in a class 1000 clean room as follows: a 2.5 g aliquot of the composition was applied to a 4-inch silicon wafer, pre-treated by O2 plasma, and spread thereon by spin coating. The coated wafer was placed on a hot plate, set at 110° C., for 3 minutes to flash off the residual solvent. After cooling to ambient temperature, the resultant film thickness was measured. Each coated wafer was then imagewise exposed, through a masking element, for 10 seconds using a CANON PLA-600 Mask Aligner having an exposure intensity of 25 mW/cm2. The pattern was developed by dipping the wafer into aqueous tetramethylammonium hydroxide (TMAH) to remove exposed portions of the layer and form a positive image of the masking element. After the TMAH solution each wafer was rinsed by dipping it into deionized water for 10 seconds and then dried by spinning at 3000 rpm for 15 seconds. Thereafter, the remaining portions of the resin layer were subjected to a flood exposure at an exposure intensity of 25 mW/cm2 for 40 seconds using the above described mask aligner without a masking element. After the flood exposures the wafers were moved into a Koyo CKO-18CD clean oven set at a temperature of 200° C. and maintained therein for 1 hour to finally dry/cure the remaining portions of the resin layer thereon.

Resin Layer Example 1

5 g of the polymer resin of Synthesis Example 1, 15 g of propyleneglycol monoethylether acetate (PGMEA), 1.5 g of silicone type epoxy resin BY16-115 (DOW Corning Toray Silicone Co., Ltd.), 0.8 g of PSM-1 and 0.5 g of silane coupling agent A-1589 (Nippon Unicar Co., Ltd.) were mixed to obtain homogeneous photosensitive resin composition (1).

Composition (1) was applied to a glass substrate, exposed, developed and cured as described above to form a positive image of the masking element employed.

Resin Layer Example 2

Photosensitive resin composition (2) was prepared in the manner of Resin Example 1 except that 5 g of the polymer resin of Synthesis Example 2 was used.

Composition (1) was applied to a glass substrate, exposed, developed by dipping in a 1.19% TMAH aqueous solution for 10 seconds, and cured as described above to form a positive image of the masking element employed.

Resin Layer Example 3

Photosensitive resin composition (3) was prepared in the manner of Resin Example 1 except that 5 g of the polymer resin of Synthesis Example 9 was used.

Composition (3) was applied to a glass substrate, exposed, developed by dipping in a 1.19% TMAH aqueous solution for 35 seconds, and cured as described above to form a positive image of the masking element employed.

Resin Layer Example 4

Photosensitive resin composition (4) was prepared in the manner of Resin Example 1 except that 5 g of the polymer resin of Synthesis Example 13 and 0.075 g of PSM-1 were used and no silane coupling agent was added.

Composition (4) was applied to a glass substrate, exposed, developed by dipping in a 1.19% TMAH aqueous solution for 30 seconds, and cured as described above to form a positive image of the masking element employed.

Determination of Properties

For each of Resin Layer Examples 1, 2, 3 and 4, values for transmittance, water absorption, dielectric constant, and an initial thermo-degradation temperature of the resin layer were determined as described below. These values are disclosed in Table 1.

Transmittance: as an indication of transparency, transmittance of beam at wavelength of 400 nm in the above mentioned glass substrate having the resin layer was measured (unit, %) using a spectrometer (UV-160 type, manufactured by Shimadzu Corporation). As a resin layer shows larger value of transmittance, it has better transparency.

Water absorption: the resin layer which was peeled from a glass substrate having the resin layer was soaked under the water at 23° C. for 24 hours to measure a rate of change in weight (unit, %) before and after soaking.

Dielectric constant: Dielectric constant of the obtained resin layer was measured according to MIL-P-55617.

Initial thermo-degradation temperature: an Initial thermo-degradation temperature was measured (unit, ° C.) at temperature rising rate of 10° C./min under nitrogen atmosphere using a thermogravimetry/differential thermal analyzer (TG/DTA 6200 type, manufactured by Seiko Instruments, Inc.).

TABLE 1

|  | Example | | | |
| --- | --- | --- | --- | --- |
|  | 1 | 2 | 3 | 4 |
| Transmittance | 94.3 | 98.6 | 99.0 | 96.1 |
| Water absorption % | 0.9 | 0.7 | 0.9 | 0.8 |
| Dielectric constant | 3.4 | 3.0 | 2.8 | 2.9 |
| Initial thermo-degradation temperature | 282 | 290 | 284 | 291 |

Resin Layer Example 5

A photosensitive composition for coating a silicon wafer was prepared, as described generally above, from 3 g of the polymer obtained in Synthesis Example 16, 4.3 g of bisphenol A type epoxy resin YD-816 (Tohto Kasei Co., Ltd.), 1.0 gram of PSM-2 and 0.5 g of silane coupling agent KBM-503 (Shin-Etsu Chemical Co., Ltd.).

The film thickness of the coated wafer was found to be 5.6 μm. The pattern was developed by dipping in a 1.19% TMAH aqueous solution for 20 seconds. Patterns as fine as 1.8 microns width line and space were formed.

Resin Layer Example 6

A photosensitive composition for coating a silicon wafer was prepared as described for Resin Layer Example 5, except that 4.9 g of bisphenol A type epoxy resin EP-4010S (Asahi Denka Co., Ltd.) was used.

The coated wafer was treated as in Resin Layer Example 5, except that the dipping time was for 25 sec. Patterns as fine as 3.5 microns width line and space were formed.

Resin Layer Example 7

A photosensitive composition for coating a silicon wafer was prepared, as described generally above, from 6 g of the polymer obtained in Synthesis Example 10, 0.72 g of YD-816 (Tohto Kasei Co., Ltd.), 0.85 g of silicone type epoxy resin BY-16-115 (Dow Corning Toray Silicone Co., Ltd.), 0.8 gram of PSM-3 and 0.5 g of silane coupling agent A-1589 (General Electric Company).

The coated wafer was treated as in Resin Layer Example 5, except that the hot plate was set for 100° C. and the time heated was 1 minute; the thickness was found to be 4.4 μm; and the dipping time was 65 sec in a 2.38% TMAH solution. Patterns as fine as 3.1 μm width line and space were formed with a final film thickness of 4.0 μm.

Resin Layer Example 8

A photosensitive composition for silicon wafer was prepared as for Resin Layer Example 7 except that 0.52 g of cyclohexylene bisglycidyl ether epoxy resin ZX-1658 (Tohto Kasei Co., Ltd.) was used in place of the BY-16-115.

The coated wafer was treated as in Resin Layer Example 7 except that the film thickness was measured to be 4.0 microns, and the dipping time was 30 seconds. Patterns as fine as 3.9 microns width line and space were formed and a final film thickness was measured to be 3.9 microns.

Resin Layer Example 9

A photosensitive composition for coating a silicon wafer was prepared as for Resin Layer Example 7 except that 0.74 g of hydrogenized bisphenol F type epoxy resin YL-6753 (Japan Epoxy Resins Co., Ltd.) was used in place of the BY-16-115.

The coated wafer was treated as in Resin Layer Example 7 the film thickness was measured to be 4.1 microns. Patterns as fine as 3.9 microns width line and space were formed and the final film thickness was measured to be 3.8 microns.

Resin Layer Example 10

A photosensitive composition for coating a silicon wafer was prepared, as described generally above, from 6 g of the polymer obtained in Synthesis Example 5, 1.2 grams of silicone type epoxy resin TSL9906 (GE Toshiba Silicones), 0.8 gram of PSM-3 and 0.5 gram of A-1289 (General Electric Company) silane coupling agent.

The coated wafer was treated as in Resin Layer Example 5 except that the wafer was placed on the hot plate 2 minutes, the film thickness was measured to be 4.0 microns and the dipping time was 5 seconds. Patterns as fine as 3.9 microns width line and space were formed and the final film thickness was measured to be 2.3 microns.

Resin Layer Example 11

A photosensitive composition for coating a silicon wafer was prepared as for Resin Layer Example 10 except that 1.4 grams of BY-16-115 was substituted for the TSL9906.

The coated wafer was treated as in Resin Layer Example 5 except that the film thickness was measured to be 4.5 microns and the dipping time was 35 seconds. Patterns as fine as 4.4 microns width line and space were formed and the final film thickness was measured to be 3.6 microns.

Resin Layer Example 12

A photosensitive composition for coating a silicon wafer was prepared as for Resin Layer Example 10 except that 2.2 grams of YD-816 was substituted for the TSL9906.

The coated wafer was treated as in Resin Layer Example 10 except that the film thickness was measured to be 3.5 microns and the dipping time was 25 seconds. Patterns as fine as 4.4 microns width line and space were formed and the final film thickness was measured to be 2.7 microns.

Resin Layer Example 13

A photosensitive composition for coating a silicon wafer was prepared, as described generally above, from 2.7 g of the polymer obtained from Synthesis Example 1 and 3.3 g of the polymer obtained in Synthesis Example 3; 1.5 grams of BY-16-115 epoxy resin, 0.8 gram of PSM-3, and 0.5 gram of polyether-based silane coupling agent SIB-0992.0 (Gelest Inc.).

The coated wafer was treated as in Resin Layer Example 10 except that the film thickness was measured to be 3.8 microns, the dipping time was 20 seconds. Patterns as fine as 5.0 microns width line and space were formed and the final film thickness 3.1 microns.

Resin Layer Example 14

A photosensitive composition for coating a silicon wafer was prepared as for Resin Layer Example 13 except that 0.5 gram of tetraethyl orthosilicate silane coupling agent (Tokyo Kasei Kogyo Co., Ltd.) was used.

The coated wafer was treated as in Resin Layer Example 10 except that the film thickness was measured to be 3.6 microns. Patterns as fine as 5.6 microns width line and space were formed and the final film thickness was 3.1 microns.

Resin Layer Example 15

A photosensitive composition for coating a silicon wafer was prepared as for Resin Layer Example 13 except that the silane coupling agent was 0.5 gram of A-1589.

The coated wafer was treated as in Resin Layer Example 10 except that the film thickness was measured to be 4.4 microns. Patterns as fine as 4.4 microns width line and space were formed and the final film thickness was 3.5 microns.

Resin Layer Example 16

A photosensitive composition for coating a silicon wafer was prepared as for Resin Layer Example 15 except that the epoxy resin was 1.5 grams hydrogenized bisphenol A type epoxy resin YX-8000 (Japan Epoxy Resins Silicone Co., Ltd.).

The coated wafer was treated as in Resin Layer Example 10 except that the film thickness was not measured and the dipping time was 25 sec. Patterns as fine as 3.1 microns width line and space were formed and the final film thickness was 3.5 microns.

Resin Layer Example 17

A photosensitive composition for coating a silicon wafer was prepared as for Resin Layer Example 15 except that the epoxy resin was 1.5 grams of biphenyl type epoxy resin YX-4000 (Japan Epoxy Resins Co., Ltd.).

The coated wafer was treated as in Resin Layer Example 10 except that the film thickness was measured to be 3.3 microns and the dipping time was 60 sec. Patterns as fine as 3.5 microns width line and space were formed and the final film thickness was 3.2 microns.

Resin Layer Example 18

A photosensitive composition for coating a silicon wafer was prepared as for Resin Layer Example 15 except that the epoxy resin was 1.5 grams of bisphenol A type epoxy resin YD-825 (Tohto Kasei Co., Ltd.).

The coated wafer was treated as in Resin Layer Example 10 except that the film thickness was measured to be 4.0 microns and the dipping time was 30 sec. Patterns as fine as 3.1 microns width line and space were formed and the final film thickness was 3.7 microns.

Resin Layer Example 19

A photosensitive composition for coating a silicon wafer was prepared as for Resin Layer Example 15 except that the epoxy resin was 1.5 grams of hydrogenized bisphenol F type epoxy resin YL-6753 (Japan Epoxy Resins Co., Ltd.).

The coated wafer was treated as in Resin Layer Example 10 except that the film thickness was measured to be 3.9 microns and the dipping time was 25 sec. Patterns as fine as 3.9 microns width line and space were formed and the final film thickness was 3.0 microns.

Resin Layer Example 20

A photosensitive composition for coating a silicon wafer was prepared as for Resin Layer Example 15 except that the epoxy resin was 1.5 grams of YD-825 and the photosensitive material was 0.8 gram of PSM-4.

The coated wafer was treated as in Resin Layer Example 10 except that the film thickness was measured to be 4.2 microns and the dipping time was 40 sec. Patterns as fine as 3.9 microns width line and space were formed and the film thickness was measured to be 4.0 microns.

Resin Layer Example 21

A photosensitive composition for coating a silicon wafer was prepared as for Resin Layer Example 20 except that the photosensitive material was 0.8 gram of PSM-5.

The coated wafer was treated as in Resin Layer Example 10 except that the film thickness was measured to be 4.3 microns and the dipping time was 35 sec. Patterns as fine as 3.5 microns width line and space were formed and the film thickness was measured to be 4.1 microns.

Resin Layer Example 22

A photosensitive composition for coating a silicon wafer was prepared as for Resin Layer Example 19 except that the epoxy resin was 1.3 grams of bisoxetane compound OXT-121 (TOAGOSEI Co., Ltd.).

The coated wafer was treated as in Resin Layer Example 10 except that the film thickness was measured to be 4.0 microns and the dipping time was 18 sec. Patterns as fine as 4.4 microns width line and space were formed and the film thickness was measured to be 3.1 microns.

Resin Layer Example 23

A photosensitive composition for coating a silicon wafer was prepared as for Resin Layer Example 19 except that the epoxy resin was 1.7 grams of bisoxetane compound Eternacol OXBP (Ube Industries Ltd.).

The coated wafer was treated as in Resin Layer Example 10 except that the film thickness was measured to be 4.2 microns and the dipping time was 35 sec. Patterns as fine as 3.5 microns width line and space were formed and the film thickness was measured to be 3.4 microns.

Resin Layer Example 24

A photosensitive composition for coating a silicon wafer was prepared, as described generally above, from 2.7 g of the polymer obtained from Synthesis Example 1 and 3.3 g of the polymer obtained in Synthesis Example 3; 0.75 g of N,N,N', N', N'', N'''-(hexamethoxymethyl) melamine (MW-390, Sanwa Chemical Co., Ltd.); 0.8 g of a photosensitive material PSM-3; 0.25 g of trifluoromethanesulfonate compound (NAI-105, Midori Kagaku Co., Ltd) as a thermal acid generator; and 0.2 g of silane coupling agent A-1589.

The coated wafer was treated as in Resin Layer Example 10 except that hot plate was set for 90° C. and the wafer heated for 2 min, the film thickness was measured to be 3.1 microns and the dipping time was 13 sec. Patterns as fine as 3.1 microns width line and space were formed and the final film thickness was 2.8 microns.

Resin Layer Example 25

A photosensitive composition for coating a silicon wafer was prepared as for Resin Layer Example 24 except that 0.8 g of N,N',N'', N'''-(tetramethoxymethyl)glycoluril (MX-270, Sanwa Chemical Co., Ltd.) was used.

The coated wafer was treated as in Resin Layer Example 24 except that the film thickness was measured to be 3.3 microns and the dipping time was 15 sec. Patterns as fine as 3.9 microns width line and space were formed and the film thickness was measured to be 3.0 microns.

Resin Layer Example 26

A photosensitive composition for coating a silicon wafer was prepared as for Resin Layer Example 24 except that the polymer obtained in Synthesis Example 7 was used.

The coated wafer was treated as in Resin Layer Example 24 except that the film thickness was measured to be 3.5 microns and the dipping time was 25 sec. Fine patterns were formed.

Resin Layer Example 27

A photosensitive composition for coating a silicon wafer was prepared as for Resin Layer Example 24 except that MX-270 was used.

The coated wafer was treated as in Resin Layer Example 24 except that the film thickness was measured to be 3.6 microns and the dipping time was 15 sec. Fine patterns were formed.

Resin Layer Example 28

A photosensitive composition for coating a silicon wafer was prepared, as described generally above, from 6 g of the polymer obtained in Synthesis Example 4; 1.4 g of BY-16-115; 0.8 g of photosensitive material PSM-3; 0.5 g of 5-norbornene 2,3-dicarboxylic acid (Sigma-Aldrich Co.); and 0.4 g of silane coupling agent A-1289.

The coated wafer was treated as in Resin Layer Example 10 except that the film thickness was measured to be 3.3 microns and the dipping time was 40 sec. Patterns as fine as 3.1 microns width line and space were formed and the final film thickness was 3.3 microns.

Resin Layer Example 29

A photosensitive composition for coating a silicon wafer was prepared, as described generally above, from 6 g of the polymer obtained in Synthesis Example 14, 1.25 g of LX-01; 0.25 g Epogose EN; 0.8 g of photosensitive material PSM-3; and 0.5 g of A-1289.

The coated wafer was treated as in Resin Layer Example 10 except that the film thickness was measured to be 3.7 microns and the dipping time was 40 sec. Patterns as fine as 3.5 microns width line and space were formed and the final film thickness was 3.6 microns.

Resin Layer Example 30

A photosensitive composition for coating a silicon wafer was prepared, as described generally above, from 6 grams of the polymer obtained in Synthesis Example 15; 1.25 g of bisphenol A type epoxy resin LX-01 (DAISO Co., Ltd.); 0.25 g of glycidylether Epogose EN (Yokkaichi Chemical Co., Ltd.); 0.8 g of photosensitive material PSM-3; and 0.5 g of A-1289.

The coated wafer was treated as in Resin Layer Example 10 except that the film thickness was measured to be 4.5 microns and the dipping time was 7 sec. Patterns as fine as 18 microns width line and space were formed.

Resin Layer Example 31

A photosensitive composition for coating a silicon wafer was prepared as for Resin Layer Example 30 except that 6 g of the polymer obtained in Synthesis Example 7 was used.

The coated wafer was treated as in Resin Layer Example 10 except that the film thickness was measured to be 4.0 microns and the dipping time was 22 sec. Patterns as fine as 5.6 microns width line and space were formed and the final film thickness was 3.8 microns.

Resin Layer Example 32

A photosensitive composition for coating a silicon wafer was prepared as for Resin Layer Example 30 except that 6 g of the polymer obtained in Synthesis Example 12 was used.

The coated wafer was treated as in Resin Layer Example 10 except that the film thickness was measured to be 3.7 microns and the dipping time was 41 sec.

Resin Layer Example 33

A photosensitive composition for coating a silicon wafer was prepared as for Resin Layer Example 30 except that 12 g of the polymer obtained in Synthesis Example 11 was used and the amounts of LX-01, Epogose EN, PSM-3 and A-1589 changed to 2.5 g, 0.5 g, 1.6 g and 1.0 g, respectively.

The coated wafer was placed on a hot plate heated at 95° C. for 2 minute to flash off the residual solvent. The film thickness was measured to be 4.4 microns. The wafer was imagewise exposed to G-line (λ=436 nm) light through a patterned chrome plated glass reticle on a NIKON NSR-G3A G-line stepper. The pattern was developed by dipping the wafer in 2.38% aqueous tetramethylammonium hydroxide for 45 seconds final film thickness was measured to be 4.2 microns.

Embodiments in accordance with the present invention have been described that are useful in the manufacture of a variety of electrical, microelectronic and optoelectronic devices such as semiconductor devices, printed wiring boards and display devices. Some of such embodiments are photosensitive resin compositions that encompass an alkali soluble polymer material having one or more types of repeating units represented by structural Formula 1, where at least one of the types of repeating units includes a pendant group having acidic functionality; a moiety containing a functional group capable of bonding with the aforementioned pendant group having acidic functionality and a photosensitive material. These embodiments encompass those where the moiety includes a compound, separate from the polymer, capable of cross-linking with the pendant group having acidic functionality as well as those where the moiety is a type of repeating unit incorporated into the polymer where this other moiety is also capable of cross-linking with the pendant group having acidic functionality. In addition, embodiments of the present invention include films formed from the aforementioned photosensitive compositions where such films can be patterned or not; methods of making such aforementioned films. Further, embodiments of the present invention encompass microelectronic devices such as semiconductor devices or multichip modules or the like, electro-optical devices such as display devices and the like that incorporate such films as well as methods used for make such devices.

The present invention has been described with reference to specific details of particular embodiments thereof. It is not intended that such details be regarded as limitations upon the scope of the invention except insofar as and to the extent that they are included in the accompanying claims.

What is claimed is:

1. An alkali soluble polymer comprising a first, a second and a third type of repeating unit derived from a monomer represented by structural Formula 10:

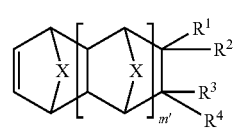

(10)

where in Formula 10, X is $(CH_2)_p$, oxygen, or sulfur, p is 1 or 2, m is an integer from 0 to 5; and each of $R^1$, $R^2$, $R^3$ and $R^4$ is independently a hydrogen, a $C_1$ to $C_{25}$ hydrocarbyl, a $C_1$ to $C_{25}$ halohydrocarbyl, a $C_1$ to $C_{25}$ perhalohydrocarbyl or one of —C(OH)—(CF$_3$)$_2$, —N(H)—S(O)$_2$—CF$_3$, —CH$_2$—(CH$_2$)$_n$—C(O)—OH, —(CH$_2$)$_n$—C(O)—R$^{31}$, —(CH$_2$)$_n$—O—C(O)—R$^{31}$, and —(CH$_2$)$_n$—O—R$^{31}$, where n is an integer from 0 to 8, R$^{31}$ is one of a mono- or multi-functional phenol represented by Formula AA, where A is optional and if present is an oxygen,

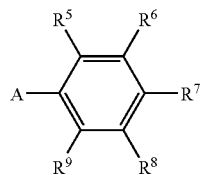

(AA)

where for a mono-functional phenol only one of R$^5$, R$^6$, R$^7$, R$^8$ and R$^9$ is —OH and the others of R$^5$ to R$^9$ are a hydrogen, a $C_1$ to $C_{25}$ hydrocarbyl, a $C_1$ to $C_{25}$ halohydrocarbyl, or a $C_1$ to $C_{25}$ perhalohydrocarbyl and where for a multi-functional phenol two or more of R$^5$ to R$^9$ are —OH and the others of R$^5$ to R$^9$ are as defined above;

with the proviso that for the monomer from which the first type of repeating unit is derived, one of R$^1$ to R$^4$ is a pendent group selected from either —C(OH)—(CF$_3$)$_2$ or —N(H)—S(O)$_2$—CF$_3$, the others being a hydrogen; and for the monomer from which the second type of repeating unit is derived, one of R$^1$ to R$^4$ is a carboxylic acid pendent group or a mono- or multi-functional phenol pendent group, the others being a hydrogen; and for the monomer from which the third type of repeating unit is derived, one of R$^1$ to R$^4$ is a pendent group selected from a $C_1$ to $C_{25}$ hydrocarbyl, a $C_1$ to $C_{25}$ halohydrocarbyl, a $C_1$ to $C_{25}$ perhalohydrocarbyl, the others being a hydrogen.

2. The alkali soluble polymer of claim 1, where the monomer from which the first repeating unit is derived comprises a —N(H)—S(O)$_2$—CF$_3$ pendent group.

3. The alkali soluble polymer of claim 1, where if the monomer from which the second repeating unit is derived comprises a carboxylic acid, the monomer from which the third repeating unit is derived further comprises a mono- or multifunctional phenol.

* * * * *